United States Patent
Zhu

(10) Patent No.: US 12,111,376 B2
(45) Date of Patent: Oct. 8, 2024

(54) IMAGING WITH SIGNAL CODING AND STRUCTURE MODELING

(71) Applicant: Yudong Zhu, Scarsdale, NY (US)

(72) Inventor: Yudong Zhu, Scarsdale, NY (US)

( * ) Notice: Subject to any disclaimer, the term of this patent is extended or adjusted under 35 U.S.C. 154(b) by 73 days.

(21) Appl. No.: 17/891,135

(22) Filed: Aug. 19, 2022

(65) Prior Publication Data

US 2022/0397624 A1      Dec. 15, 2022

Related U.S. Application Data

(63) Continuation of application No. 15/655,852, filed on Jul. 20, 2017, now abandoned.

(51) Int. Cl.
| | |
|---|---|
| G01V 3/00 | (2006.01) |
| G01R 33/483 | (2006.01) |
| G01R 33/54 | (2006.01) |
| G01R 33/56 | (2006.01) |
| G01R 33/561 | (2006.01) |
| G01R 33/58 | (2006.01) |
| G01R 33/46 | (2006.01) |
| G01R 33/48 | (2006.01) |

(52) U.S. Cl.
CPC ...... *G01R 33/5611* (2013.01); *G01R 33/4835* (2013.01); *G01R 33/543* (2013.01); *G01R 33/5608* (2013.01); *G01R 33/561* (2013.01); *G01R 33/583* (2013.01); *G01R 33/4616* (2013.01); *G01R 33/4818* (2013.01)

(58) Field of Classification Search
CPC .............. G01R 33/543; G01R 33/5659; G01R 33/3415; G01R 33/36; A61B 5/055
USPC ......................................................... 324/309
See application file for complete search history.

(56) References Cited

U.S. PATENT DOCUMENTS

| | | | | |
|---|---|---|---|---|
| 6,236,862 | B1* | 5/2001 | Erten | H04B 1/123 |
| | | | | 455/501 |
| 2007/0252597 | A1* | 11/2007 | Posse | G01R 33/485 |
| | | | | 324/318 |
| 2015/0192654 | A1* | 7/2015 | Zhu | G01R 33/5611 |
| | | | | 324/309 |

FOREIGN PATENT DOCUMENTS

| | | | | |
|---|---|---|---|---|
| CN | 1265471 A | * | 9/2000 | ........... G01N 24/081 |
| CN | 101694652 A | * | 4/2010 | |
| CN | 104809695 A | * | 7/2015 | |
| CN | 104182943 B | * | 12/2015 | |
| WO | WO-9414084 A1 | * | 6/1994 | ............. G01S 17/48 |
| WO | WO-2006006915 A1 | * | 1/2006 | ............... G06T 9/00 |

(Continued)

OTHER PUBLICATIONS

JP 2011527669 A (No Name). (Year: 2011).*

(Continued)

*Primary Examiner* — Walter L Lindsay, Jr.
*Assistant Examiner* — Frederick Wenderoth

(57) ABSTRACT

A technology is provided for multi-component and/or multi-configuration imaging with coding, signal composition, signal model, structure model, structure model learning, decoding, reconstruction, performance prediction and performance enhancement. A magnetic resonance imaging example comprises acquiring signal samples in accordance with a coding scheme and a k-space sampling scheme, identifying a structure model in a data assembly formed using an extraction operation, and generating a result consistent with both the acquired signal samples and the identified structure model.

18 Claims, 16 Drawing Sheets

Signal contributing components    Coded signals from exciting and marking the components    A detected net composite signal

(56) References Cited

FOREIGN PATENT DOCUMENTS

WO     WO-2011064512 A1 *   6/2011    ......... A61B 5/0263

OTHER PUBLICATIONS

KR 101650891 B1 (Park) (Year: 2016).*
EP 0577363 A1 (Wilson) (Year: 1994).*
CN 104603629 A1 (Beck) (Year: 2015).*

* cited by examiner

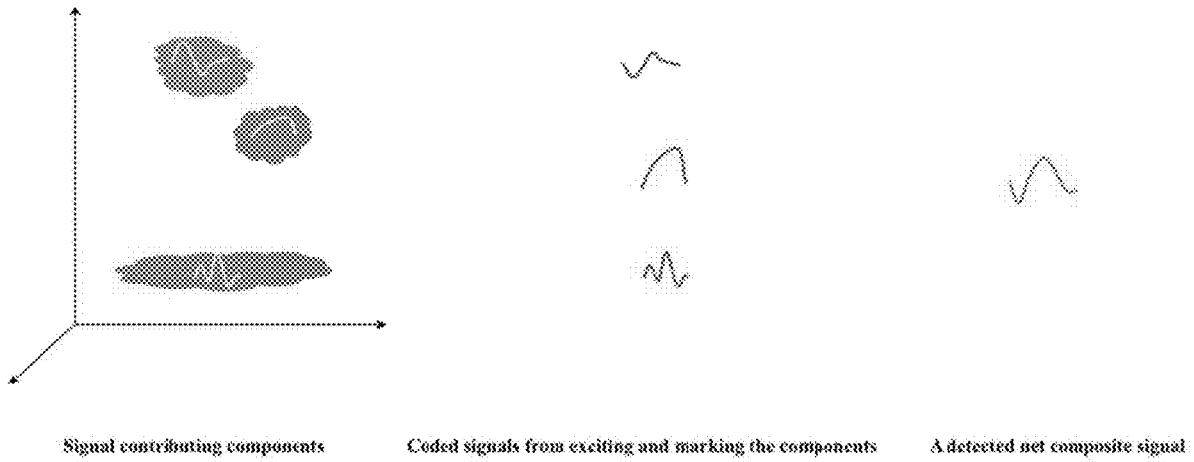
Fig.1
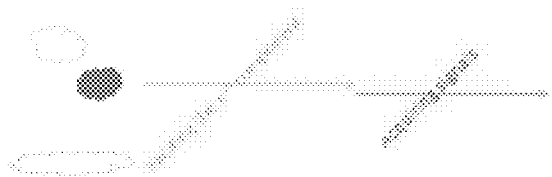 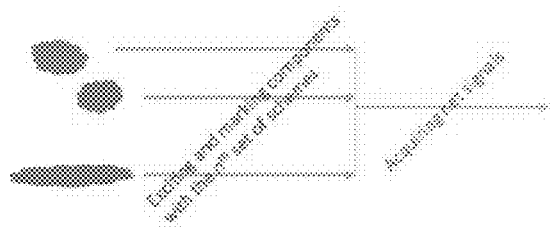
Fig.2

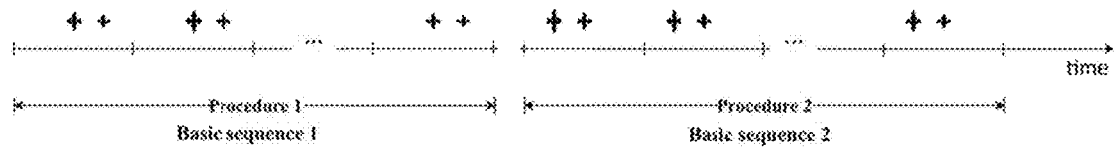
Fig.3A
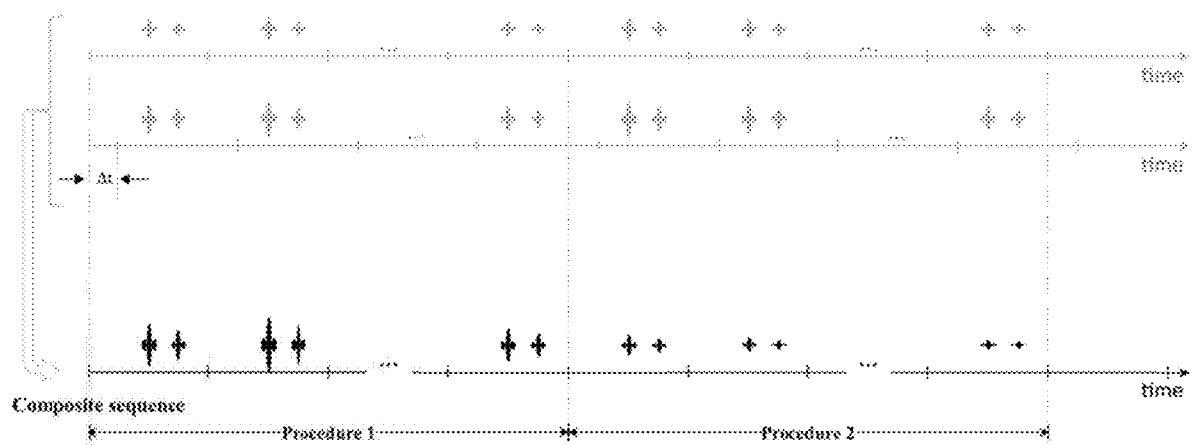
Fig.3B
Fig.4

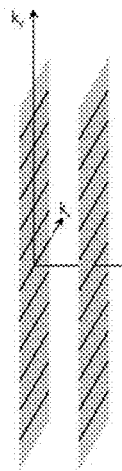
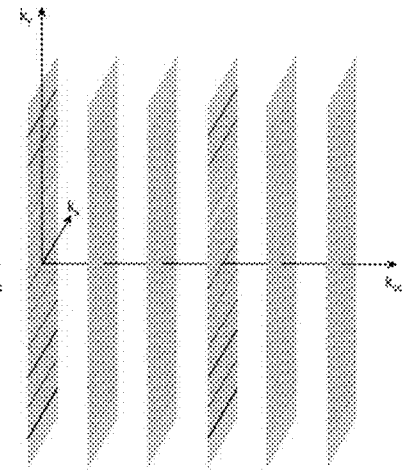
Fig.6A  Fig.6B  Fig.6C
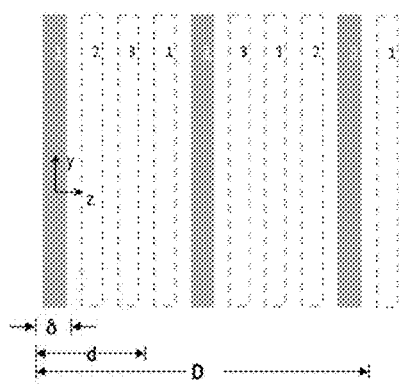
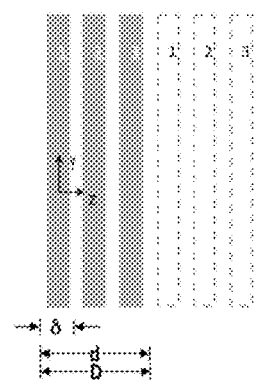
Fig.7A  Fig.7B

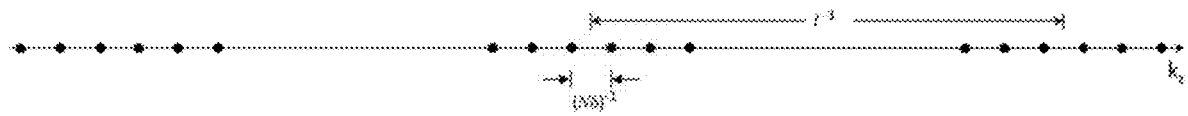

A 6-slice example with $\Delta k_z=1/(N\delta)$. Further resolving $Q=3$ voxels across slice thickness $l$ employs 2 additional groups that are $1/l$ away from the original ($l=\delta/2$ in this illustration)

Fig.8

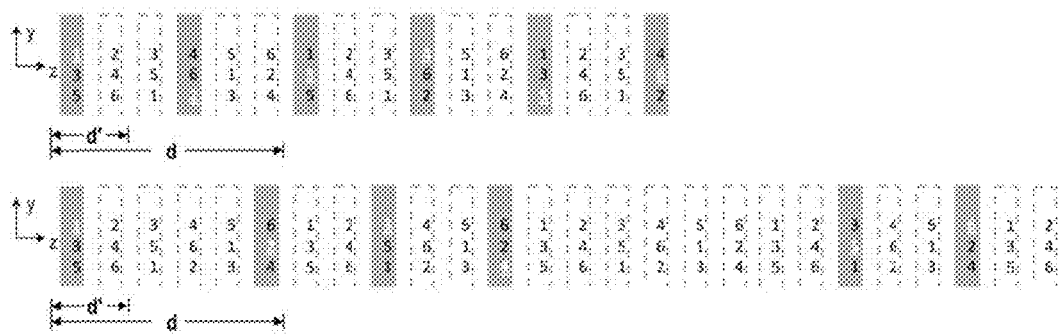

With acceleration, k-space sampling period $1/d'$ can be coarser than $\Delta k_z = 1/d$.
Fig.9A and B illustrate application of 3x acceleration in two 6-slice imaging examples.

Fig.9

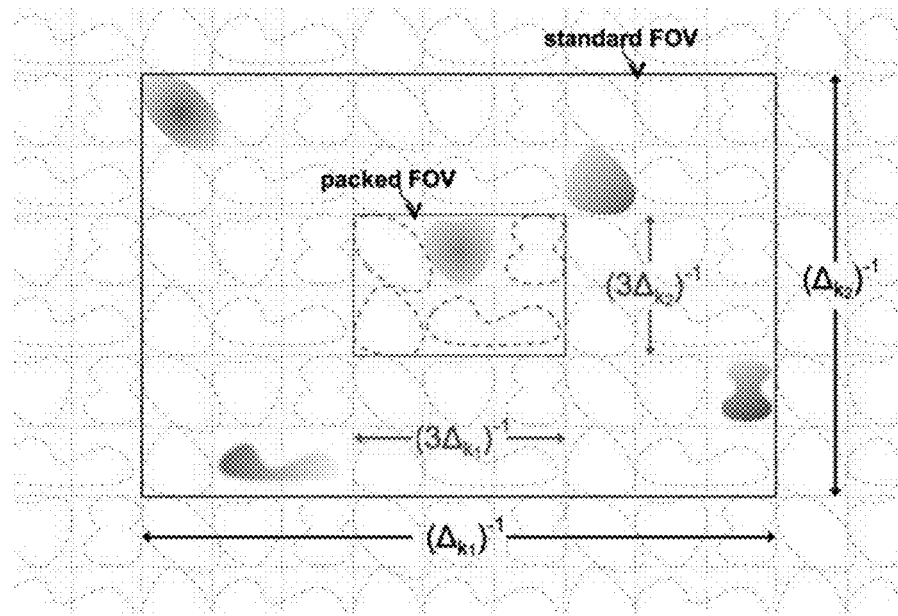

FOV-packing Taking advantage of the gaps between clusters of excited spins in the standard FOV, sampling k-space much coarser than the Nyquest rate (e.g., 3x coarser than $\Delta_{k1}$ and 3x coarser than $\Delta_{k2}$, as shown) avoids overlaps amongst signals (actual as well as aliased), which in effect reduces the task of MRI's signal acquisition stage to one of resolving the packed FOV.

Fig.10 reconstructed slices reconstructed slices $$\left\{\begin{array}{l}\text{Equations expressing conformity with a signal model}\\ \text{Equations expressing conformity with a structure model}\\ \text{Equations expressing conformity with additional models}\end{array}\right.$$

Fig.19A

Find a result that minimizes the sum of at least one selected from the group comprising
    a metric on deviation from a signal model,
    a metric on deviation from a structure model,
    and a metric on deviation from models that capture additional knowledge.

Fig.19B

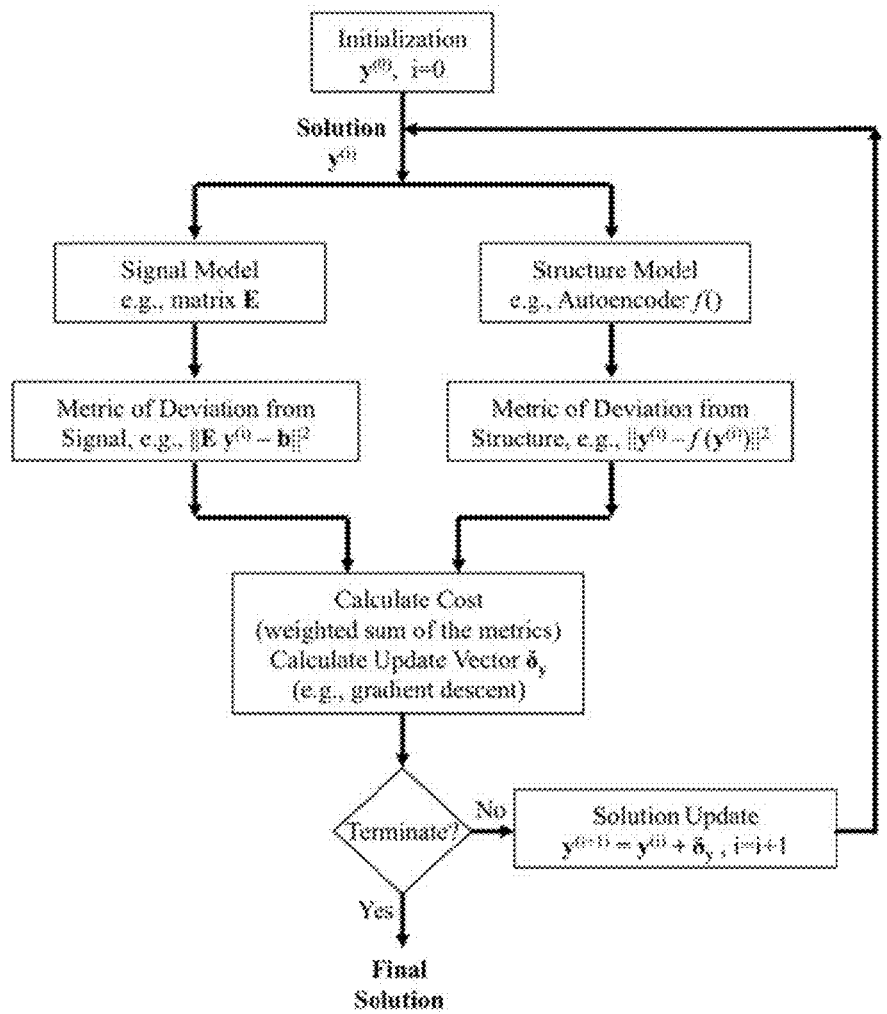

Fig.19C

IMAGING WITH SIGNAL CODING AND STRUCTURE MODELING

This is a continuation of application Ser. No. 15/655,852, filed 2017 Jul. 20. This application claims the benefit of PPA Application No. 62/364,892 filed 21 Jul. 2016 and PPA Application No. 62/482,700 filed 7 Apr. 2017 by the present inventor, which are incorporated by reference.

BACKGROUND

In magnetic resonance imaging (MRI) a significant portion of noise in detected signals originates from the scanned patient. Despite improvement of scanner hardware and detector sensitivity there remains a meager limit on signal-to-noise ratio (SNR) in clinical MRI, which impedes uncovering of fine details and improvement of scan speed. In fact one primary drive for increasing the magnetic field strength of modern-day clinical MRI has been to reap a proportional increase in SNR. The past decade has witnessed wide spread adoption of 3 T scanners by healthcare facilities around the world as well as vigorous technical development for imaging at 7 T or even higher field strengths. However there are major challenges associated with pushing the field strength to 3 T and beyond, including cost of instrumentation and operation, degradation of image uniformity and contrast fidelity, escalation of radio-frequency (RF) energy absorption or SAR, and increased complexity addressing standards and compliances.

The present invention identifies and explores a unique opportunity. By its nature MRI seeks to resolve a set of individual components, which entails mapping their distribution spatially, spectrally, or in a general parameter space. The present invention seeks to maximize SNR for any given scan time budget. Its essence, hereby termed signal coding, is to push for noise decimation by collecting sums of coded signals of all the components. In comparison, existing methods tend to collect signals of a subset of the components at a time. Signal coding can be implemented through a rich variety of mechanisms and is applicable in imaging modalities beyond MRI.

Given the, multitude of possibilities implementing signal coding, including readily accessible ones hereby illustrated, the invention promises to bring significant upgrades to many popular protocols as well as to provide a boost for SNR-starved or lower-geld MRI applications, A large fraction of clinical MRI protocols are multi-slice based. For them the invention creates a new regime, one that enjoys both a √N-fold SNR enhancement, as analogous to that associated with volumetric MRI, and flexibility with scan time budget, as equal or superior to that of conventional multi-slice MRI. In a sense the new regime is a nimble version of volumetric MRI—it samples a target volume with little constraint and has at its disposal a capacity for full-fledged 3D acceleration. The SNR and flexibility benefits are significant as simultaneously managing time and SNR continue to be of top interest to clinical MRI.

For signal decoding and image reconstruction, the present invention provides a comprehensive framework. Structure modeling, one of the framework's core elements, facilitates image reconstruction by exploiting resemblance amongst or redundancy within images of multiple configurations. The structure modeling and the framework are extendable to a wide variety of applications, helping improve the speed and efficiency of imaging.

BRIEF DESCRIPTION OF THE DRAWINGS

FIG. 1 illustrates the signal coding concept with an exemplary embodiment.

FIG. 2 illustrates procedures for an embodiment of the present invention (right column) and compares it with that employed for a conventional practice (left column).

FIG. 3A-3B illustrate an exemplary composite sequence.

FIG. 4 illustrates an embodiment of signal coding where signals are coded by means of modulating weights.

FIG. 6A-6C illustrate $k_x$-$k_y$-$k_{sc}$ sampling patterns corresponding to three exemplary embodiments of multi-slice signal coding.

FIG. 7A-7B illustrate an embodiment that exemplifies use of gradient-based signal coding for multi-slice imaging.

FIG. 8 is an illustration of an embodiment that exemplifies use of gradient-based signal coding for multi-slice imaging and sub-slice spatial resolution.

FIG. 9 is an illustration of an embodiment that exemplifies accelerated multi-slice FIG. 10 is an illustration of the FOV-packing concept.

FIG. 19A-19C illustrate exemplary reconstruction formulations.

DETAILED DESCRIPTION

Figure 5:
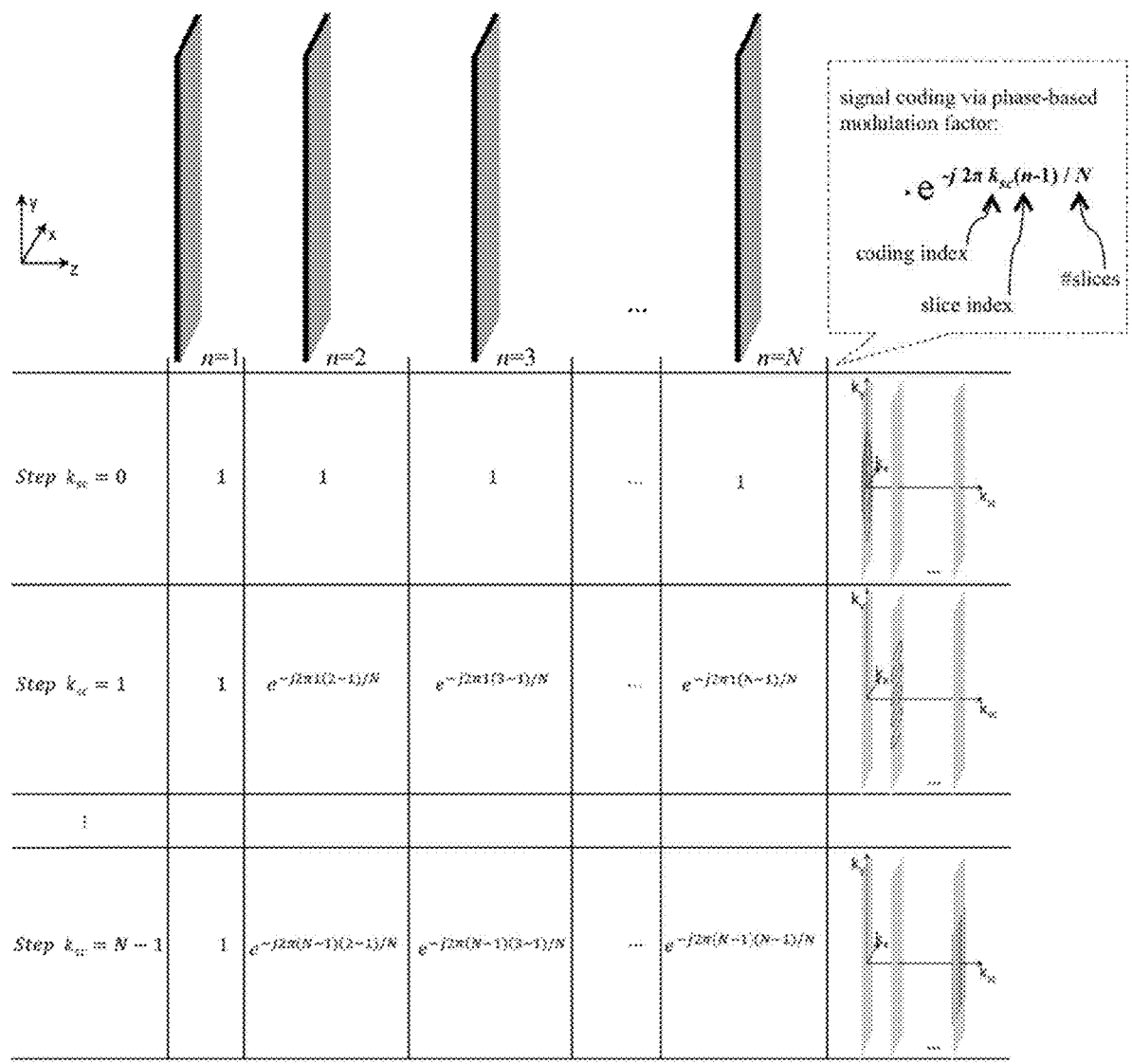
FIG. 5 illustrates an exemplary multi-slice imaging embodiment of the present invention.

Signal Coding Basics and an SNR Multiplying Effect

A scanned object in MRI can be viewed as a collection of components that 1) spread in a space of spatial, spectral or other characteristic dimensions, and 2) contribute to detected signals, by way of transverse magnetization, in response to radio-frequency excitation. The goal of MRI is to actively and systematically probe the components, and to distinguish, resolve or map them in said multi-dimensional space. To achieve this goal existing methods often employ selective excitation and apply, deliberately, an isolation strategy. For example, in multi-slice MRI, a common clinical practice, the MR scanner is programmed to excite components of, and acquire signals from, one slice at a time. In this case, each time the slice-selective excitation localizes signals to a slice (i.e., a subset of components), reducing further spatial mapping to that of a 2D task.

While conceptually straightforward, this isolation strategy misses a significant SNR opportunity. The present invention demonstrates that given a time budget for imaging multiple components, or multiple subsets of components (e.g., tissues distributed over multiple slice locations, resonance frequencies or other dimensions of characteristic parameters), one can often achieve significantly better SNR by acquiring sums of coded signals from all the components than by acquiring signals from one component, or one subset of the components, at a time. This strategy of signal coding (or, in the case of MRI, echo composition) embodies a notion of integration rather than isolation. Also notice a nesting feature: a subset of components is a component at a higher conceptual level—the remaining of this document shall simply use the word component or components, unless when multiple levels need to be discussed in one passage.

FIG. 1 illustrates the signal coding concept with an example embodiment. For resolving N components, imaging with an isolation strategy would each time acquire a basic signal from one of the N components. In comparison, imaging with the signal coding strategy would each time acquire a composite signal that is contributed by all the components and is in effect a sum of N modified or marked basic signals. While the conventional strategy loops through the N components probing all the components separately, the new strategy loops through N sets of modification schemes probing all the components simultaneously. The modification schemes are designed such that an acquired set of composite signals allow the N components be distinguished, resolved or mapped in the multi-dimensional space. FIG. 2 illustrates logically organized procedures for an embodiment of the present invention (right column) and compares them with that employed for a conventional practice (left column).

In one aspect, the new technology composes a composite sequence to gain MRI enhancements—it combines basic sequences by 1) judiciously aligning and consolidating their data acquisition modules to allow detection of composite signals or echoes, and 2) properly modifying and integrating other elements (e.g., RF excitation modules and special gradient pulses).

For multi-component imaging to access signal coding benefits, at least some of the echoes probing the components need to be aligned in time in a procedure—this allows composite echoes be formed and measured with the actual (composite) sequence that is played out in imaging experiments. RF pulses shall be aligned or staggered. Larger TR's shall be integer-multiples of smaller ones if multiple TR values are involved. FIG. 3 illustrates a 2-component example, where a composite sequence replaces two basic sequences. In this case the TE's are different while the TR's are the same. In general, the probing experiments the composite sequence pools may cause different components to experience different effects due to RF field, gradient field, B0 field, and imaging sequence timing.

Being able to code signals through excitation that is component-selective facilitates coding implementation, but is not a necessity. Other mechanisms that effect sufficiently diverse composition would work too. For a task of resolving N components of different chemical shifts for example, properly varying TE's amongst the procedures would induce phase-based coding. The composite sequence idea can have wide-ranging applicability and can inspire further development.

It may appear counter-intuitive for one to exploit a signal mixing strategy while one's goal is to track down individual signal sources. It is a matter of necessity under circumstances—for example, the usual sharing of localization burden in imaging sequences, where selective excitation leaves signals from many voxels mixed instead of isolating the signals by exciting the voxels one by one. In many important cases however, it is also a matter of opportunity—for example, an opportunity to "maximize SNR for a same amount of images or acquisitions", which is one of the points the present invention accentuates.

Leveraging the mechanisms for manipulating spin dynamics and modifying MR signals, an imaging scan can excite and mark the target components in a number of ways. The mechanisms include modulating the radio-frequency field, gradient field, B0 field and imaging sequence timing. A properly crafted coding scheme, thereby carried out allows the components be distinguished afterwards while effecting noise decimation through an intensified cancelation. The more effective the coding scheme is, the more signal fidelity and noise decimation the final results manifest.

FIG. 4 illustrates an embodiment of signal coding where signals are coded by means of modulating weights. Eqn.1 expresses the relation between the basic signals and the composite signals.

$CompositeSignal_1(t) = c_{1,1} \times Signal_1(t) +$ [Exemplary equation 1]

$c_{1,2} \times Signal_2(t) + \ldots + c_{1,N} \times Signal_N(t)$ $CompositeSignal_2(t) =$ $c_{2,1} \times Signal_1(t) + c_{2,2} \times Signal_2(t) + \ldots + c_{2,N} \times Signal_N(t)$ $\vdots$ $CompositeSignal_M(t) =$ $c_{M,1} \times Signal_1(t) + c_{M,2} \times Signal_2(t) + \ldots + c_{M,N} \times Signal_N(t)$ In matrix form, Eqn.1 is equivalently expressed as $$y = Cx,$$ [Exemplary equation 2]

$$C = \begin{bmatrix} c_{1,1} & c_{1,2} & \ldots & c_{1,N} \\ c_{2,1} & c_{2,2} & \ldots & c_{2,N} \\ & & \vdots & \\ c_{M,1} & c_{M,2} & \ldots & c_{M,N} \end{bmatrix}, x = \begin{bmatrix} Signal_1(t) \\ Signal_2(t) \\ \vdots \\ Signal_N(t) \end{bmatrix},$$

$$\text{and } y = \begin{bmatrix} CompositeSignal_1(t) \\ CompositeSignal_2(t) \\ \vdots \\ CompositeSignal_M(t) \end{bmatrix}$$

Acquired MR signals are inevitably corrupted by measurement noise, which affects reconstruction and image SNR. For a detection channel that is susceptible to an additive noise process, the acquired signal vector can be expressed as $$y = Cx + \epsilon$$

where $\epsilon$ is a noise sample vector representing the effect of the additive noise process. Let R be the covariance matrix of $\epsilon$, the classic solution to x is given by the best linear unbiased estimate:

$$\hat{x} = (C^H R^{-1} C)^{-1} C^H R^{-1} y$$ [Exemplary equation 3]

where $\hat{x}$ denotes the estimated or reconstructed x given a measured y. $COVAR(\hat{x})$, the covariance matrix of noise in $\hat{x}$, can be shown to be $$COVAR(\hat{x}) = (C^H R^{-1} C)^{-1}$$ [Exemplary equation 4]

The nth diagonal entry of COVAR($\hat{x}$) represents noise variance of reconstructed Signal$_n$(t).

The configuration or design of the coding matrix C is key to signal coding performance. In an important, practical example where the measurement noise is characterized by R=$\sigma^2$I and C is designed to be N-by-N with $c_{m,n}=e^{-j\pi mn/N}$:

$$\text{COVAR}(\hat{x})=(C^H R^{-1}C)^{-1}=\sigma I/N.$$

In comparison, inducing and detecting Signal$_n$(t)'s separately (following the isolation strategy) results in COVAR ($\hat{x}$)=$\sigma^2$I. The use of signal coding in this example realizes a reduction of noise standard deviation, and a corresponding enhancement of SNR, by a factor of $\sqrt{N}$.

In essence, signal coding achieves noise reduction by increasing noise averaging and cancellation. There are various approaches to signal coding. Noted below are some thoughts.

- Signal$_1$, Signal$_2$, ..., and Signal$_N$ themselves can be results of signal coding or conventional spatial encoding—nested/concatenated application enables complete resolution of components over multiple dimensions/levels
- For enhancing SNR while preserving multi-dimensional mapping power, an MRI system can use RF, gradient or other means to accomplish the signal coding, leveraging the diverse and effective mechanisms accessible for manipulating spin dynamics and modifying MR signals.

Phase modification schemes admit relatively straightforward implementations. Signal coding schemes involving amplitude modification or sophisticated modifying functions offer more possibilities, but might need to address possible challenges such as alteration of image contrast, perturbation to steady state, nonlinearity of spin dynamics, variations of electromagnetic fields, and computational cost.

- Each individual act of signal coding is the application of a modifying function. Keeping the modifying functions linear tends to facilitate signal decoding or image reconstruction, as well as SNR analysis/prediction.

The simple signal coding example above also illustrates an explicit signal decoding that operates directly on the acquired signals, time point by time point, before the rest of the reconstruction procedure takes the baton and completes image reconstruction. Through a quick noise calibration where RF transmit remains shut (i.e., no spin excitation) and signal acquisition collects noise samples, channel noise can be characterized and R determined. $(C^H R^{-1}C)^{-1}C^H R^{-1}$ is then calculated and stored. As the actual imaging scan proceeds, signal decoding can be performed on-the-fly with simple calculations (Eqn.3).

An alternative approach has signal decoding fully integrated into image reconstruction, which can be handy when imaging employs, for example, parallel receive-based acceleration. Parallel receive MRI, with or without acceleration, maps transverse magnetization or reconstructs MR images by processing radio-frequency MR signals that are acquired in parallel with multiple receive channels. For any one of the channels, its spatially varying detection sensitivity causes the channel to sense an intermediate transverse magnetization that is a product of the sensitivity profile with the true transverse magnetization (or, from a k-space perspective, an intermediate spectrum that results from a convolution of a kernel with the true transverse magnetization's spectrum). Consider as an example, application of signal coding in N$_c$-channel parallel receive multi-slice MRI. The following equation relates individual channel images (i.e., intermediate transverse magnetization maps) to the acquired signal samples:

$$\underbrace{\begin{bmatrix} c_{1,1}F_1 & c_{1,2}F_1 & \cdots & c_{1,N}F_1 \\ c_{2,1}F_2 & c_{2,2}F_2 & \cdots & c_{2,N}F_2 \\ & & \vdots & \\ c_{M,1}F_M & c_{M,2}F_M & \cdots & c_{M,N}F_M \end{bmatrix}}_{E} \underbrace{\begin{bmatrix} y_1 \\ y_2 \\ \vdots \\ y_N \end{bmatrix}}_{y} = \underbrace{\begin{bmatrix} b_1 \\ b_2 \\ \vdots \\ b_M \end{bmatrix}}_{b},$$

$$\text{where } F_m = \begin{bmatrix} F_m & 0 & 0 \\ 0 & \ddots & 0 \\ 0 & 0 & F_m \end{bmatrix}, y_n = \begin{bmatrix} y_n^{(1)} \\ \vdots \\ y_n^{(N_c)} \end{bmatrix} \text{ and } b_m = \begin{bmatrix} b_m^{(1)} \\ \vdots \\ b_m^{(N_c)} \end{bmatrix}.$$

[Exemplary equation 5]

In Eqn.5:
- $y_n$, the nth block of vector y, pools individual channel images corresponding to the nth slice.
- $b_m$, the mth block of vector b, pools samples of the channels' spectra as acquired by N$_c$ parallel receive channels at the mth coding procedure.
- $F_m$ is a block-diagonal matrix composed of N$_c$ identical matrices $F_m$ on its diagonal and zeros elsewhere. Each $F_m$ represents an N$_c$-channel Fourier transform operator that corresponds to the k-space traversing and sampling (as set by the spatial-encoding gradient pulses) in effect for the mth coding procedure.

Note that for any one of the channels, its modeling is a subset of the equations in Eqn.5, and is in accordance with pooling Eqn.2's for the channel's all sampling time points. Single-channel receive is a special case of Eqn.5.

In a more general setup of M-procedure N-component signal coding and N$_c$-channel parallel receive, $c_{m,n}$(t)'s, time varying coding coefficients for the mth procedure, may be employed (e.g., $c_{m,n}$(t)'s assume the form of piece-wise constant functions that vary from one segment of the k-space trajectory to the next). Consider an example signal model:

$$s_m^{(n_c)}(t)=\rho_n c_{m,n}(t)\int M_n^{(n_c)}(r) \\ e^{-j\gamma \Delta B_0(r)t} e^{j2\pi k_m(t)\cdot r} dr \quad \text{[Exemplary equation 6]}$$

The underlined term in the equation is a linear function on $M_n^{(n_c)}(r)$, the nth component's intermediate transverse magnetization as sensed by the n$_c$th channel. Let $F_{m,n}y_n^{(n_c)}$ be a corresponding discretized representation. The linear equations that link the individual channel images to the acquired signal samples can be expressed as $$\underbrace{\begin{bmatrix} F_{1,1} & F_{1,2} & \cdots & F_{1,N} \\ F_{2,1} & F_{2,2} & \cdots & F_{2,N} \\ & & \vdots & \\ F_{M,1} & F_{M,2} & \cdots & F_{M,N} \end{bmatrix}}_{E} \underbrace{\begin{bmatrix} y_1 \\ y_2 \\ \vdots \\ y_N \end{bmatrix}}_{y} = \underbrace{\begin{bmatrix} b_1 \\ b_2 \\ \vdots \\ b_M \end{bmatrix}}_{b}, \quad \text{[Exemplary equation 7]}$$

$$\text{where } F_{m,n} = \begin{bmatrix} F_{m,n} & 0 & 0 \\ 0 & \ddots & 0 \\ 0 & 0 & F_{m,n} \end{bmatrix}, y_n = \begin{bmatrix} y_n^{(1)} \\ \vdots \\ y_n^{(N_c)} \end{bmatrix} \text{ and } b_m = \begin{bmatrix} b_m^{(1)} \\ \vdots \\ b_m^{(N_c)} \end{bmatrix}.$$

Given a sufficient amount of acquired signal samples, solving these signal equations leads to reconstructed images. Linear models exemplified by Eqns 5 and 7 are further discussed in a later section in the context of accelerating both signal coding and conventional spatial encoding with multi-channel parallel receive, as well as in the context of leveraging closed-form solutions to predict image SNR prior to actual imaging scans.

Signal Coding for Imaging Multiple Slices

A large fraction of clinical MRI protocols are multi-slice based. An especially significant application of the present invention is to upgrade them, creating desired performance enhancements by leveraging both the SNR multiplying effect and a potent support for scan acceleration. Example embodiments described in this section give, from a signal coding/spatial encoding perspective, simple illustrations of said support for scan acceleration.

Using phase modulations is a special case of using modulating weights. High quality phase modulation can be implemented by programming RF pulse phases. FIG. 5 illustrates an example embodiment of the present invention. In composing a composite sequence that implements the embodiment, N aligned RF pulses are added together where each has not only a specific center frequency for defining a desired slice position but a phase that is modulated in accordance with a multiplying factor:

$$e^{-j2\pi k_{sc}(n-1)/N}$$ [Exemplary equation 8]

Eqn.8 does not tie n to spatial location or ordering. In multi-slice imaging therefore, one may set arbitrary gaps among the slices and, if with acceleration of signal coding, flexibly assign spatial locations to aliasing group(s) (thus tweaking g-factor). Notice that gradient-based phase modulation is an alternative (see descriptions in later sections) in which case RF pulse phase modulation is replaced by programmed gradient pulsing.

The FIG. 5 example contains N procedures, corresponding to steps $k_{sc}=0, 1, \ldots, N-1$. The gradient pulsing and the $k_{sc}$ setting jointly drive k-space sampling. Each $k_{sc}$ step can have its own $k_x$-$k_y$ sampling pattern (e.g., Cartesian, radial, spiral, or even semi-random patterns, as driven by 1 the gradient pulses). As demonstrated in section A Building Block Approach, acceleration by simultaneously skipping some of the $k_{sc}$ steps (i.e., under-sampling along $k_{sc}$) and under-sampling $k_x$-$k_y$ has full-fledged support from parallel receive. Such support for full 3D acceleration, together with the SNR multiplying effect, represent an unprecedented speed and SNR advance for multi-slice MRI.

The $k_x$-$k_y$-$k_{sc}$ sampling and, m the case of parallel receive, the receive sensitivity profiles, significantly influence the fidelity and SNR of reconstructed images. A build block approach described in section A Building Block Approach, including demonstrated reconstruction formulation (e.g., Eqn.18) and SNR prediction (e.g., Eqn.19), provides a tool for quantifying the influence, using only specifics about signal coding/spatial encoding (captured by E), information about parallel acquisition signal structure/BI⁻ profiles (from calibration or simulation, captured by W) and noise level of acquired signal samples (from noise calibration). One embodiment of the present invention is to use said specifics and information to quantify said influence, and to further conduct under the guidance of the quantification, in an iterative fashion when appropriate, adjustment i optimization of coding, encoding or coils prior to actual scans. Considering the numerous possibilities for receive coils, coil-patient configurations, spatial encoding, signal coding and imaging locations, proactive adjustment/optimization can be rather beneficial.

For sampling with Cartesian trajectories, FIG. 6 illustrates $k_x$-$k_y$-$k_{sc}$ sampling patterns corresponding to three example embodiments of multi-slice signal coding. FIG. 6A shows a pattern with $k_x$-$k_y$ under-sampling but full sampling along k, FIG. 6B shows a pattern with under-sampling both over $k_x$-$k_y$ and along $k_{sc}$. In addition to under-sampling in 3D, the pattern in FIG. 6C illustrates a signal coding scheme (Eqn.6) which has an additional phase modulation among the parallel trajectory segments. This additional phase modulation may help manage 'g-factor' associated with the 3-fold acceleration along $k_{sc}$, as can be quantified/minimized by leveraging the building block approach.

Let FOV, denote full y-direction field-of-view. Let $acc_{ky}$ and $acc_{ksc}$ denote $k_y$- and $k_{sc}$-direction acceleration factors respectively. A good intuitive scheme for the additional phase modulation is one that uses a linear phase roll to effect an incremental $1/acc_{ky}/acc_{ksc}$ $FOV_y$ shift (not $1/acc_{ksc}FOV_y$ shift) between slices in any aliased group—for example, FIG. 6C scheme gives rise to two aliased groups: Slices 1, 3 and 5 and Slices 2, 4 and 6—this and similar $k_x$-$k_y$-$k_{sc}$ sampling schemes need to take into account the $k_x$-$k_y$ under-sampling when configuring the additional phase modulation. Certainly, there are more opportunities with general sampling trajectories and signal coding schemes— these three examples are special cases that have a popular ingredient (even sampling Cartesian trajectories) and are intuitive to grasp.

Section A Building Block Approach has further demonstrations of under-sampling and SNR quantification.

Gradient-Based Signal Coding

It is useful to view multi-slice MRI as a spatially sampled version of volumetric MRI. Such a perspective facilitates understanding and implementation of signal coding.

One embodiment exemplifies N-slice imaging with gradient-based signal encoding. FIG. 7A illustrates its basic principle with an example, where three (N=3) excited slices orthogonal to z, each occupying a depth of no more than δ, sample a volume of depth D. Whereas, for the volume, Nyquest sampling rate of the $k_z$ dimension is $\Delta k_z=1/D=(9\delta)^{-1}$, sampling of the k, dimension in this multi-slice case can be much coarser while still avoiding aliasing-induced interferences. As FIG. 7A shows, at a sampling rate of $\Delta k_z=1/D=(9\delta)^{-1}$ (three times coarser than the Nyquest rate) overlaps amongst aliasing lobes remain absent. The three excited slices can be resolved in the z dimension with an adapted version of conventional volumetric encoding and reconstruction that has z-gradient ($G_z$) effecting $k_z$ sampling only at $k_z=-1/d$, 0 and $1/d$, rather than at 40 or more $k_z$ locations as typical of a conventional volumetric encoding. The present embodiment is applicable to general N-slice configurations, including ones with smaller (e.g., the example illustrated with FIG. 7B), larger, or uneven spacing between excited slices.

A link to the Eqn.8-based signal coding can be appreciated by examining the z-dimension part of the adapted volumetric encoding:

$$e^{-j2\pi k_z z} \approx e^{-j2\pi k_z n\delta} = e^{-j2\pi m\Delta k_z n\delta} = e^{-j2\pi mn/N}.$$ [Exemplary equation 9]

This characterizes any N-slice δ-grid case that is with $\Delta k_z$ set to $(N\delta)^{-1}$. Notice $e^{-j2\pi mn/N}$ has a period of N in both n and n. A suitable spectral and spatial sampling configuration is one in which the locations of excited slices correspond to mod(n,N) covering 0 to N−1 and the encoding steps correspond to mod(m,N) covering 0 to N−1—such a configuration gives the same full set of coding schemes as specified by Eqn.8. For the FIG. 7A example, the spectral and spatial sampling correspond, respectively, to {m=−1, 0 and 1} and {n=0, N+1 and 2N+2}. For the FIG. 7B example, the spatial sampling corresponds instead to {n=0, 1 and 2}.

Unlike the RF-based implementation however, finite slice thickness (hence the approximation in Eqn.9) affects mapping accuracy somewhat, as can be analyzed with, for example, a point spread function (psf) approach. Note that the psf corresponding to the spectral and spatial sampling described above is a sinc-type with a main-lobe width of 2δ and zero-crossings at distances of multiples of δ from the main-lobe center. The thickness of excited slices dominate the z-dimension spatial resolution—when the slices are thin relative to δ each reconstructed voxel reflects overwhelmingly signals from one slice with negligible contamination from others.

In a nutshell, the present embodiment is implemented by adapting a conventional volumetric encoding, where the adaptation involves the use of multi-slice selective excitation and considerably reduced $k_z$ sampling.

As is clear, any one of many adequate in-plane spatial encoding or $k_x$–$k_y$ sampling schemes can be used in conjunction with signal coding to accomplish spatial mapping in x-y as well as z dimensions. Yet another nested/concatenated application is to further improve the z-dimension spatial resolution beyond the slice thickness. For example, with RF excitation pulses/z-gradient pulses, one can introduce Q sets of phase rolls across the slices. This, together with a signal coding scheme of Eqn.8 or Eqn.9 type, can effect a z-direction phase scheme indexed by integers m, n and q as follows $$e^{-j2\pi(\frac{q}{l})z}e^{-j2\pi mn/N} \quad \text{[Exemplary equation 10]}$$

where l is the slice thickness and q assumes Q values, e.g., $-Q/2+1, \ldots, 0, 1, \ldots, Q/2$. The q-indexed phase factor represents spatial encoding across the slice thickness with an FOV of l and a spatial resolution of l/Q. Once the individual slices have been resolved, further refining z-dimension resolution of each slice by reconstructing Q voxels across the slice thickness can be based on applying discrete Fourier transform or solving simple linear equations. For cases with parallel receive acceleration, reconstruction can use methods described in a later section. Apart from a spatial resolution consideration, this example scheme allows use of thick slices or slabs. In essence, it illustrates a most efficient way of k-space sampling for imaging a group of gapped objects. FIG. 8 shows the k-space sampling pattern of an example implementation (N=6, l=δ/2 and Q=3).

The present embodiment supports acceleration of signal coding with a $\Delta k_z$ that is significantly greater than $(N\delta)^{-1}$. FIGS. 9A and B illustrate two 3-fold accelerated N=6 examples, where $\Delta k_2$ is $(2\delta)^{-1}$ instead of $(6\delta)^{-1}$. In either example, $G_z$ need to effect $k_z$ sampling only at two $k_z$ locations: $k_z=0$ and $(2\delta)^{-1}$. Compared to these, counterpart conventional volumetric encoding schemes require $\Delta k_z$'s of $(16\delta)^{-1}$ and $(24\ \delta)^{-1}$, and a much greater number of $k_z$ sampling locations.

Coding acceleration correspond to mod(m,N) covering only a subset of $\{0, 1, \ldots N-1\}$. When signal acquisition is supported by multi-channel parallel receive, methods described in a later section are effective in handling signal acquisition and image reconstruction.

To boost SNR of multi-slice fast spin echo imaging, one method is to adapt standard volumetric FSE imaging with the present embodiment. To image a 3D volume standard volumetric FSE applies frequency encoding to one spatial dimension, and two separate sets of phase encoding to the other two spatial dimensions. A multi-slice FSE with the present embodiment has one of the volumetric FSE's two sets of phase encoding replaced by a substantially coarse set as specified by Eqn.9 (or Eqn.10 if for multiple thin or thick slabs). The new multi-slice FSE also has the volumetric FSE's 90° volume excitation replaced with a sum of N slice-selective 90° excitations (or slab-selective excitations if for multiple slabs). Reconstruction of images from acquired signal samples uses the method described above or, if with parallel receive based acceleration, the method described in A Building Block Approach.

Compared to long-TR, acquisition-interleaved conventional multi-slice FSE, the new multi-slice FSE may use a longer echo train length or signal coding acceleration to avoid a scan time penalty while retaining some significant SNR advantage. Using a sum of slice- or slab-selective 180°'s is an option for enabling group-interleaved acquisition. The new multi-slice FSE may have some advantage in SAR, especially if, instead of the simplistic sum of 90°'s, it employs a dedicated multi-slice or multi-slab 90° excitation that is designed to leverage the periodicity of the selectivity profile.

Field-of-View Packing

An embodiment related to the description above introduces a Field-of-View Packing concept to facilitate intuitive use of gradient-based signal coding and improvement of spatial resolution.

As FIG. 10 illustrates, taking advantage of the gaps between clusters of excited spins in the standard FOV, sampling k-space much coarser than the Nyquest rate avoids overlaps amongst signals (actual as well as aliased), which in effect reduces the task of MRI's signal acquisition stage to one of resolving the packed FOV.

By exploiting a packable configuration and performing FOV-packing, one probes or samples an extensive area with a considerably lower cost than that required by the standard Nyquest rate. While the excitation control supplies cluster locations, the k-space sampling of the signal acquisition stage leads to finer details. It suffices for the latter to work with the packed FOV, hence coarser k-space sampling. The present embodiment may therefore provide much superior resolution and/or speed than a standard technique.

For multi-slice imaging the present embodiment treats it as a straightforwardly adapted volumetric MRI—it simultaneously excites N target slices that are fitted conceptually to organizing bins of a packable configuration, and acquires signals in accordance with the packed FOV (i.e., $k_x$–$k_y$-$k_z$ sampling with considerable under-sampling along $k_z$ but otherwise normal). FIG. 7A can illustrate FOV-packing in multi-slice MRI. Three excited slices (number labels underscored) orthogonal to z, each conceptually occupying an organizing bin of depth δ, sample a volume of depth D=9 δ. The packed FOV is of depth d=Nδ=3δ. At a sampling rate of 1/d (3× coarser than the Nyquest rate of 1/D), overlaps amongst signals (including aliased, black-labeled) remain absent. Imaging the three, slices entails sampling $k_z$ at −1/d, 0 and 1/d. Extending the width of $k_z$ coverage with P·N (P>1) sampling steps narrows the PSF and resolves P voxel across each δ interval. This enables going beyond the slice thickness and resolving δ/P-thick sub-slices.

For even k-space sampling cases, the present embodiment reconstructs multiple slices with inverse Fourier transform. An intrinsic agility in terms of total number of spatial encodes is present since for separating the N slices along z, as few as N $k_z$ sampling steps are needed. With the non-overlapping condition as the base, proper slice profiles and recon PSF jointly effect projections across short z-intervals, one for each individual slice, with negligible cross-talk amongst the projections. To improve z-direction spatial resolution beyond the slice thickness, the present embodiment employs P·N sampling steps to narrow the PSF and resolve P voxel across each δ interval, producing sub-slices of resolution δ/P.

Parallel receive acceleration, along all three dimensions simultaneously if desired, is applicable to the present embodiment as it is to usual volumetric MRI. FIG. 9 can illustrate how to integrate parallel-receive acceleration by further reducing FOV from a packed-FOV base. Note that while the base is the packed FOV, the clusters being imaged through it carries receive sensitivities across the relatively extensive original FOV. This helps manage g-factor of parallel MRI when it reduces the FOV beyond the base. If desired the present embodiment can additionally modulate multi-slice excitation to effect integrated use of gradient- and RF-based signal coding.

A Building Block Approach

Signal coding works with or without parallel receive. Nonetheless, parallel receive does otter a significant capacity supporting acceleration of signal coding—it would allow a reduction in the number of signal coding steps, as it would in the number of conventional spatial encoding steps. In view of this capacity as well as the prevalent use of multi-channel receive coils, the present invention puts forward a comprehensive framework applicable to simultaneous exploitation of signal coding and parallel MRI. It represents a building-block approach with modules A-G hereby described. Tackling parallel receive. MRI by integrating the modules under the framework is relatively straightforward, as illustrated below with examples of multi-slice signal-coded parallel MRI.

The building block approach facilitates adaptation and expansion. In one aspect the building block approach is applied to multi-configuration imaging, which collects data and generates images by leveraging an intrinsic resemblance or redundancy. Imaging with multi-channel receive is a special case of multi-configuration imaging.

(A) Signal Structure Model

Parallel MRI maps transverse magnetization and reconstructs MR images by processing radio-frequency MR signals that are acquired in parallel with multiple receive channels. For any one of the channels, its spatially varying detection sensitivity causes the channel to sense an intermediate spectrum that results from a convolution of the transverse magnetization's spectrum with a kernel. For all of the parallel receive channels, the spectra sensed by them differ from one another only by convolution effects due to the channels' sensing profiles. In parallel acquisition MR signals, and in $\Xi$, the spectra sensed by the parallel receive channels, a structure is thereby embedded. The receive channels' sensing profiles, arising from radio-frequency BI⁻ fields, usually assume smooth weighting profiles in the image-space and narrow-width convolution kernels in the k-space.

FIG. 11 illustrates the concept of parallel acquisition signal structure with an MRI example. FIG. 11A: A k-space sampling pattern defines, for a multi-channel parallel acquisition, sampled locations 1101 and skipped locations 1102. Compared to sampling at a full Nyquest rate, skipping of some of the grid point locations allows the acquisition to go faster. Samples at skipped locations are not directly known but potentially reconstructable. A parallel acquisition signal structure can be identified and exploited through a conceptual stencil 1103 dissecting the k-space.

Figure 11A:
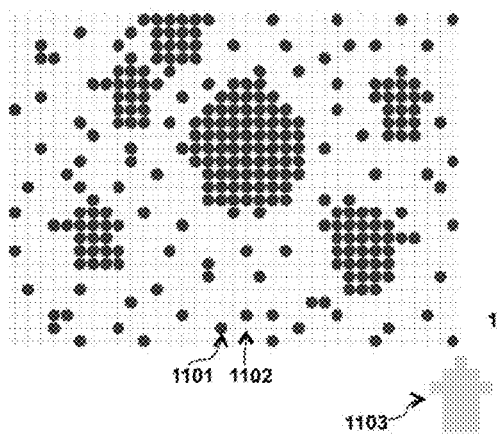
FIG. 11A-11D illustrate a parallel acquisition signal structure in an MRI example.
Figure 11B:
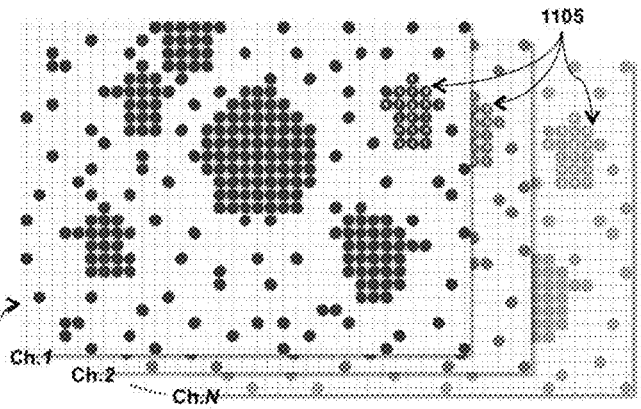
Figure 11C:
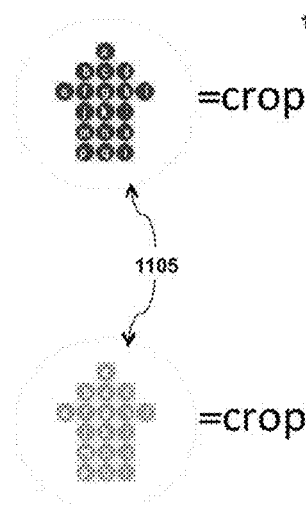

FIGS. 11B and C: For any one of the parallel signal acquisition channels, its spatially varying sensitivity causes it to sense an intermediate spectrum 1104 that results from a convolution of a shift-invariant kernel 1106 with the transverse magnetization's spectrum. The stencil 1103 in the present example is a block arrow that covers 18 grid points for each channel at each placement location. At one placement location, the result 1105 of the convolutions in the stencil-demarcated neighborhood is known. This makes an instance that contributes to signal structure identification, despite a lack of knowledge of the kernels (one per channel) and the relevant portion 1107 of the transverse magnetization's spectrum.

Figure 11D:
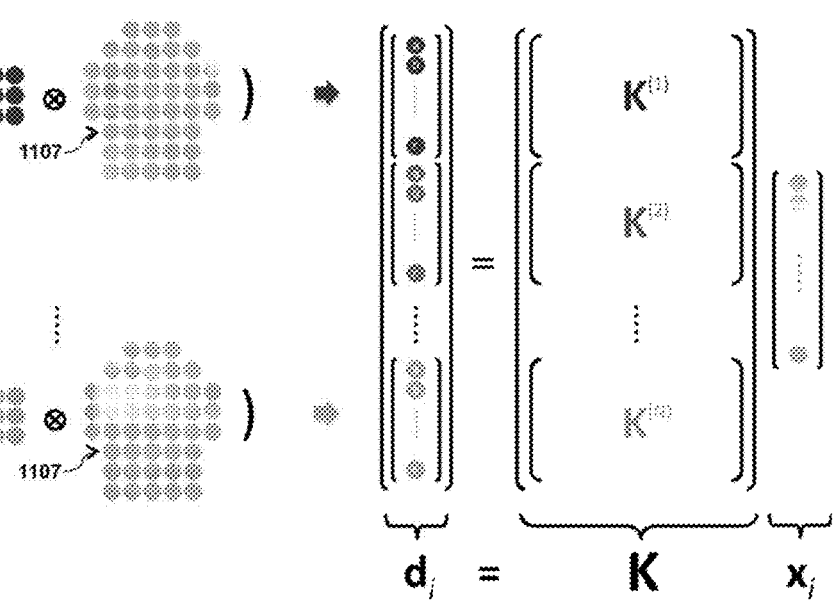

FIG. 11D: The convolution principle gives rise to a mathematical expression for describing relationship between k-space grid samples. In particular, for any given stencil a shift-invariant matrix K exists that relates samples of $\Xi$ to samples of the magnetization's spectrum with equation $d_i = K x_i$, where i is a location index for the stencil placement over the k-space grid, $d_i$ contains known or unknown samples of $\Xi$ collected by the stencil, and $x_i$ contains samples of the magnetization's spectrum in a support neighborhood defined by the stencil and the convolution kernels. The placement location illustrated in FIG. 11B corresponds to a known $d_i$. A placement location corresponds to a partially known $d_i$ if the stencil-demarcated neighborhood is under-sampled.

The stencil in this example case assumes the shape of a block arrow. Numerous other shapes however, can be appropriate choices for a stencil. The illustrated idea can be extended to higher dimensional cases, including an analogous case with volumetric images, corresponding spectra, and a designed stencil that extends along three k-space dimensions as well as over the channels.

As FIG. 11 elucidates, a parallel acquisition signal structure may be revealed and exploited through a conceptual stencil dissecting the k-space. For any one of the parallel signal acquisition channels, its spatially varying sensitivity causes it to sense an intermediate spectrum that results from a convolution of a kernel with the transverse magnetization's spectrum. In accordance with this convolution principle, for any given stencil a shift-invariant matrix K exists that relates samples of $\Xi$ to samples of the magnetization's spectrum:

$$d_i = K x_i, \forall i \qquad \text{[Exemplary equation 11]}$$

where i is a location index for the stencil placement over the k-space grid, $d_i$ contains samples of $\Xi$ collected by the stencil, and $x_i$ contains samples of the magnetization's spectrum in a support neighborhood defined by the stencil and the convolution kernels. Eqn.11 arises from the convolution principle and involves no other assumptions. The linear equation form is generally valid in describing k-space grid samples, the Fourier transform of which are images.

The number of rows in K is equal to $n_s \times N_c$, where $n_s$ is the number of samples the stencil collects from a channel's spectrum at one placement location ($n_s = 18$ in FIG. 11), and $N_c$ is the number of parallel receive channels. The number of columns in K, denoted as $n_K$, is equal to the number of samples in the support neighborhood where the magnetization's spectrum contributes to the $n_s \times N_c$ samples. Note that $r_K$, the dimension of the column space of K or the number of independent columns in K, is less or equal to $n_K$. In an example case where kernels are as broad as w-point across and the dissecting stencil is an l-point wide square stencil, $n_K \leq (l+w-1)^2$.

The physics of sensitivity weighting gives rise to a projection-invariance property. Expressing $d_i$ as a weighted sum of the columns of K, Eqn.11 states that $d_i$ belongs to the column space of K, i.e., the vector space spanned by K's column vectors. Thus Eqn.11 equivalently states that the projection of $d_i$ onto the column space of K results in $d_i$. This projection invariance may be expressed as follows:

$$d_i = P d_i, \forall i \qquad \text{[Exemplary equation 12]}$$

where matrix P denotes the projection. One way to construct P is through a product $P=UU^H$, where columns of matrix U are vectors of an orthonormal basis for the column space of K and $^H$ denotes complex conjugate. For parallel MRI it is typically neither possible nor necessary to unambiguously resolve K. Yet identifying the column space and confining $d_i$'s to the space leads to a set of constraining equations for the reconstruction of $\Xi$ and images, helping resolve unknowns and contain noise.

A signal structure space, or the column space of K, can be identified from acquired signal samples (see Calibration and the W's) and then transformed into a parallel acquisition signal structure (PASS) model to enable image reconstruction.

Eqn.11, and equivalently Eqn.12, is valid everywhere. Consider a k-space sweep. At each step of the sweep the stencil assembles samples, acquired or unknown, and constrains the resulting vector to be in the identified signal structure space. A full sweep gives a full set of constraints:

$$d_i = UU^H d_i, i=1,2, \quad \text{[Exemplary equation 13]}$$

Mathematical conversions can facilitate the computation involved in imposing the full set of constraints due to the identified signal structure. With the identified U matrix, $UU^H$, the projection operator is known. Eqn.13 ties any sample, in a known, shift-invariant fashion, to weighted sums formed in the sample's neighborhoods in the spectra. This therefore gives rise to a set of $N_c$ constraints in convolution form:

$$\begin{cases} z^{(1)} = w^{(1,1)} \otimes z^{(1)} + w^{(1,2)} \otimes z^{(2)} + \ldots + w^{(1,N_c)} \otimes z^{(N_c)} \\ \vdots \\ z^{(N_c)} = w^{(N_c,1)} \otimes z^{(1)} + w^{(N_c,2)} \otimes z^{(2)} + \ldots + w^{(N_c,N_c)} \otimes z^{(N_c)} \end{cases} \quad \text{[Exemplary equation 14]}$$

where $z^{(n)}$ represents the spectrum in $\Xi$ that corresponds to the nth channel, $\otimes$ denotes convolution, and the w's are the convolution functions derived from U. Fourier transform further converts the convolution operations into spatial weighting operations in image space, giving rise to a set of $N_c$ rapidly quantifiable constraints on the individual channel images:

$$\begin{cases} y^{(1)} = W^{(1,1)} \times y^{(1)} + W^{(1,2)} \times y^{(2)} + \ldots + W^{(1,N_c)} \times y^{(N_c)} \\ \vdots \\ y^{(N_c)} = W^{(N_c,1)} \times y^{(1)} + W^{(N_c,2)} \times y^{(2)} + \ldots + W^{(N_c,N_c)} \times y^{(N_c)} \end{cases} \quad \text{[Exemplary equation 15]}$$

In Eqn.15, $y^{(n)}$, the image corresponding to the nth channel, represents the inverse Fourier transform of $z^{(n)}$, and $W^{(m,n)}$, the $(m,n)^{th}$ spatial weighting function, represents inverse Fourier transform of $w^{(m,n)}$.

Transformed from Eqn.13, the convolution form (Eqn.14) or the weighted superposition form (Eqn.15) expresses the signal structure constraints due to imaging physics. For reconstructing $\Xi$ and images, imposing the signal structure constraints by applying Eqn.11, 12 or 13 everywhere is equivalent to imposing the set of $N_c$ constraints with Eqn.14 or 15. Use of Eqn.15 offers a notable advantage in computation efficiency owing to the $N_c^2$ low-cost weighting (multiplication) operations.

In summary, Eqns. 15 and 14 express PASS model equivalently. They arise from physical principles of multi-sensor parallel acquisition, and are generally valid in describing respectively, images and spectra. Their parameters (W's and w's) are to be determined with calibration. The role of PASS model is to help resolve unknowns/contain noise during reconstruction of images and spectra.

B) Calibration and the W's

Wherever supported fully by available samples of $\Xi$ the stencil assembles the samples into a vector belonging to the signal structure space, adding to the knowledge of the latter. This can be appreciated by organizing multiple such instances as follows:

$$D_{ID} \stackrel{def}{=} [d_1 \quad d_2 \quad \ldots] = K[x_1 \quad x_2 \quad \ldots], \quad \text{[Exemplary equation 16]}$$

In the identification process, $D_{ID}$, whose columns are made of known $d_i$'s, is known. It is clear that, despite the lack of knowledge of the x's, when there are enough instances to allow assembly of $r_K$ independent column vectors for $D_{ID}$ the signal structure space can be identified and a U matrix determined. For the sampling pattern and stencil definition illustrated in FIG. 11, in identifying the signal structure space the six clusters shown support 30+ instances of stencil placements hence a $D_{ID}$ matrix with 30+ columns.

In practice, U can be determined with, for example, QR factorization or SVD of matrix $D_{ID}$. Even though diversity of neighborhoods in the magnetization spectrum implies that $r_K$ independent column vectors may well result from as few as $r_K$ instances, in the presence of measurement noise, it is useful to employ more instances and hence more known $d_i$'s to strengthen the robustness of the identification process. For this SVD of $D_{ID}$ with thresholding can be handy, where one ranks the singular values and attributes the basis vectors associated with the more significant singular values as the ones spanning the signal structure space.

There are various methods for collecting data that are used in the calibration. It is clear that as long as the sensitivity profiles stay the same the samples used in the structure space identification can be acquired in one or more sessions that are separate from the session(s) that produce b. For example the session(s) involved in the identification can take place at a different time and/or assume a different MR image contrast. This, in conjunction with the numerous possibilities for designing/combining stencils, for assembling/organizing $D_{ID}$'s (Eqn.16) and for leveraging low-rank matrix completion techniques, allows for enhancements in terms of flexibility and efficiency. For certain k-space traversing trajectories, e.g., radial and spiral trajectories, gridding of samples from densely sampled k-space center region may generate enough data for the calibration hence sparing some efforts.

Figure 12A:
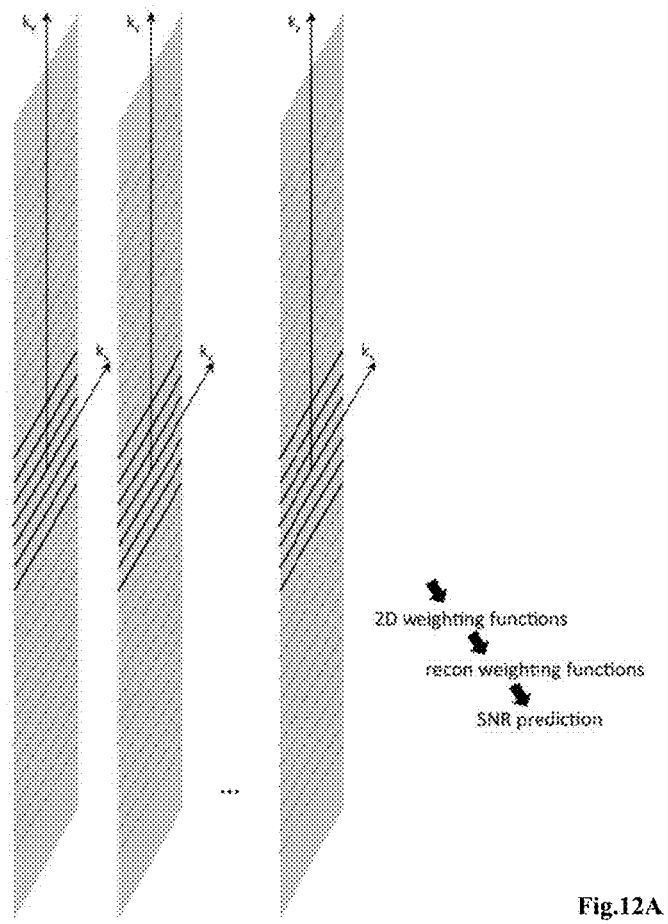
FIG. 12A-12B illustrate exemplary methods for collecting parallel receive calibration data.
Figure 12B:
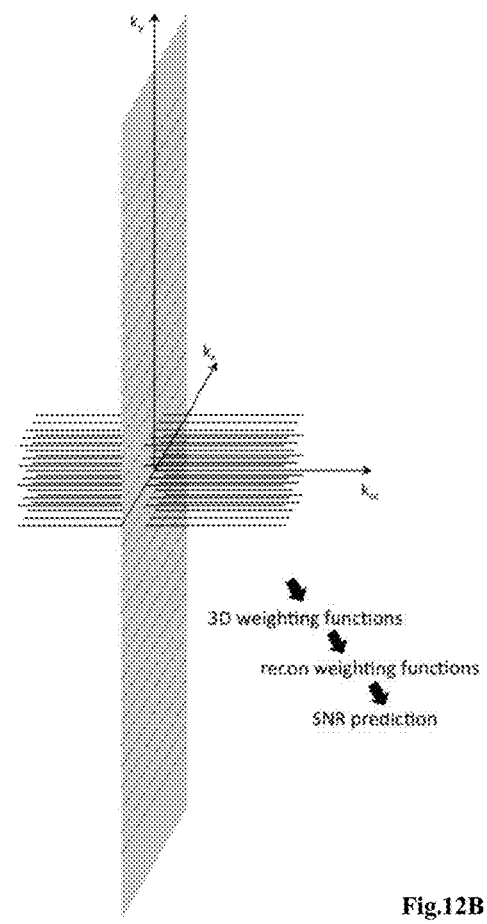

In accordance with Eqn.15, $W^{(m,n)}$'s, the spatial weighting functions, only need to be valued where the image voxels are to be reconstructed. For multi-slice parallel receive MRI, FIG. 12A illustrates an example embodiment where, for each of the slices, full sampling over center k-space (refer to the dark lines parallel to the $k_x$ axis) is employed to supply data and generate a set of $N_c^2$ 2D weighting functions. FIG. 12B illustrates an example embodiment where, for a 3D volume of interest, full sampling over center 3D k-space (refer to the spokes parallel to the $k_z$ axis) is employed to supply data and generate volumetric $W^{(m,n)}$ profiles. These profiles in turn are sampled at target voxel locations, generating a set of $N_c^2$ 2D weighting functions per slice. This second approach can be advantageous accommodating flexible slice prescriptions. As aforementioned, the k-space traversing trajectories and timing can be tailored to effect fast and robust calibration of the W's.

Once calibrated, Eqn.15-form PASS model, for example, can be expressed for multi-slice parallel receive MRI using a set of linear equations:

$$\underbrace{\begin{bmatrix} (I-W_1) & & & 0 \\ & (I-W_2) & & \\ & & \ddots & \\ 0 & & & (I-W_N) \end{bmatrix}}_{I-W} \underbrace{\begin{bmatrix} y_1 \\ y_2 \\ \vdots \\ y_N \end{bmatrix}}_{y} = \underbrace{\begin{bmatrix} 0 \\ 0 \\ \vdots \\ 0 \end{bmatrix}}_{0}, \quad \text{[Exemplary equation 17]}$$

where the calibrated 2D weighting functions substantiate the $W_n$ matrices, which in turn form the block-diagonal matrices W and I-W. Eqn.17 adopts the same y notation as that in Eqns. 5 and 7—$y_n$, the nth block of vector y, pools individual channel images corresponding to the nth slice.

C) Signal Model and Image Reconstruction Formulation

Signal equations that link the individual channel images to the acquired signal samples, e.g., Eqns. 5 and 7, together with equations expressing PASS model, e.g., Eqn.17, form the foundation for image reconstruction. An example reconstruction formulation, based on a straightforward integration of an Eqn.7—form signal model with Eqn.10—form PASS model, is as follows:

$$\underbrace{\begin{bmatrix} \alpha(I-W) \\ E \end{bmatrix}}_{A} y = \begin{bmatrix} 0 \\ b \end{bmatrix}, \quad \text{[Exemplary equation 18]}$$

Solving Eqn.18 for y reconstructs images of the parallel receive channels. When spatial encoding and/or signal coding "under-sample" to such a degree that inversion of E y=b becomes ill-posed or poorly-conditioned, incorporating PASS model as Eqn.18 does may resolve the issue and make robust reconstruction of y possible. This exemplifies a formal way of explaining parallel receive's acceleration capacity. In principle, given the spatial encoding and signal coding schemes (hence E) and calibrated PASS model (hence I-W), acceleration feasibility, noise propagation, and potential optimization, can be evaluated by analyzing the matrix. Illustrations are provided in Prediction of recon result noise level and SNR.

Square root of sum of squares of individual channel images (√sos), a common combination scheme, can be used to synthesize a composite image based on a set of individual channel images. It can be shown however that 1) √sos is a spatially weighted version of the transverse magnetization, 2) √sos is a weighted superposition of individual channel images, and the weighting profiles for forming the superposition can be calculated from the W's, and 3) Eqn.18, with a simple modification, supports direct reconstruction of a composite image, facilitating SNR prediction/additional formulations.

While nominally set to 1, the non-negative scalar $\alpha$ in Eqn.18 should, ideally, be set to emphasize the more reliable one of the two sets of equations (namely, (I-W) y=0 and E y=b) to benefit image SNR. In a case where the first set is very reliable, e.g., due to a robust scheme for signal structure identification or an effective incorporation of additional sources of knowledge, choosing a large $\alpha$ can be beneficial. In such a case one can analytically track noise propagation, predict image noise standard deviation and introduce further optimizations. COMPASS technology (U.S. patent application Ser. No. 14/588,938) offers these and other tools for practicing parallel receive MRI.

Signal coding coupled with Eqn.18—type reconstruction formulation is significant to multi-slice parallel receive MRI—it exemplifies a fall-fledged and versatile technology for boosting SNR, leveraging 3D acceleration and covering a target. In comparison, conventional methods largely ignore the through-plane dimension, and recent acceleration methods (e.g., CAIPIRINHA and blipped CAIPI) tend to have intrinsic, strict constraints in teens of SNR, number of slices, acceleration, and k-space traversing patterns.

Figure 13A:
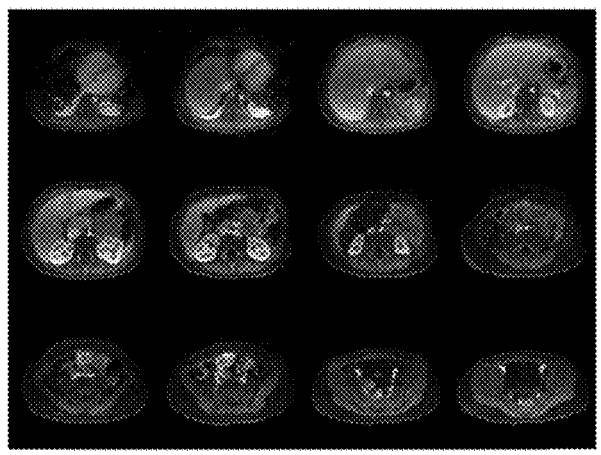
FIG. 13A-13C illustrate an imaging example that uses signal coding, spiral k-space sampling trajectories and parallel receive acceleration.
Figure 13B:
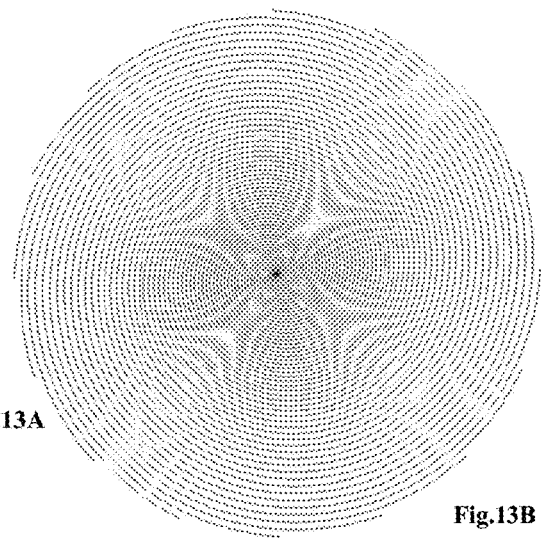
Figure 13C:
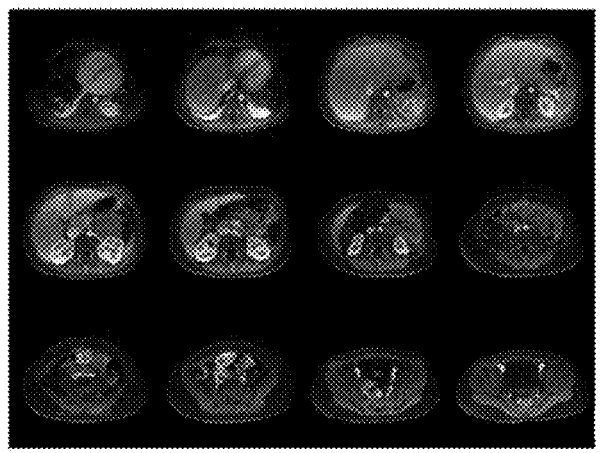

FIG. 13 illustrates an abdomen imaging example where a 32-channel receive coil array was used for parallel acquisition of signal samples. A scheme of the type illustrated by FIG. 5 was used to signal-code and spatial-encode 12 transaxial slices: the signal data input to reconstruction reflect RF-based phase modulation with 3× acceleration ($e^{-j2\pi mn/12}$, with m=0, 3, 6 and 9) and a same 16-arm $k_x$–$k_y$ spiral sampling trajectory for all four signal coding steps (varying density with outer k-space under-sampled—see FIG. 13B). The targeted slices have a uniform center-to-center spacing of 19 mm, which are shown in FIG. 13A as a reference. A separate calibration using FIG. 12B—type 3D scheme is used to derive W. An Eqn.18-form reconstruction equation is assembled using the coding and encoding specifics as well as the W, and then solved with a conjugate gradient iterative solver (lsqr). The least squares solution gives 12 reconstructed transaxial images shown in FIG. 13C. With the fast spiral trajectory and the 3D acceleration, this example represents a case of rapid imaging.

Figure 14A:
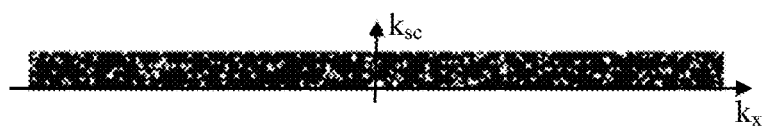
FIG. 14A-14B illustrate an imaging example that uses signal coding, random spoke k-space sampling trajectories and parallel receive acceleration.
Figure 14B:
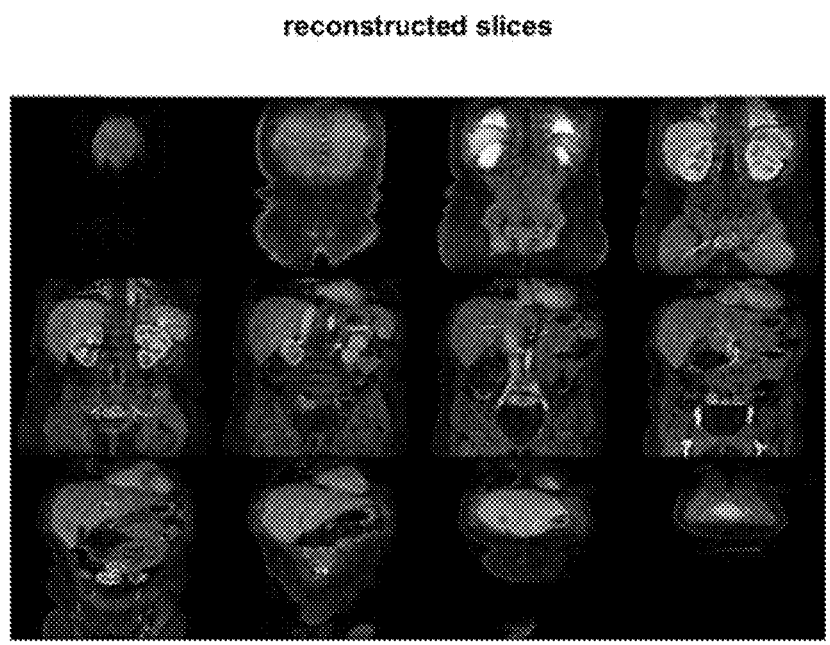

FIG. 14 illustrates another abdomen imaging example that is with 32-channel parallel receive. A scheme of the type illustrated by FIG. 5 was used to signal-code and spatial-encode 12 coronal slices. In this example the k-space sampling trajectory is composed of segments parallel to $k_z$ (z=S/I). Sampling of $k_x$–$k_{sc}$ is of a pseudo-random pattern reflecting a 9× acceleration (FIG. 14A). The targeted slices have a uniform center-to-center spacing of 12 mm. A separate calibration using FIG. 12B—type 3D scheme was used to derive W. For reconstruction, taking a Fourier transform along k, first converts acquired signal data into samples in $k_x$–$k_{sc}$–z. This reduces the Eqn.18—form reconstruction equation into a number of smaller, separate equations, one for each z location. Solving these smaller equations leads to reconstruction of voxels in x-y-z space, which are readily reformatted to generate reconstructed coronal images (FIG. 14B). With random sampling spokes, this example is supportive of additional compressed sensing modeling (see Advanced modeling and generalization).

Figure 15:
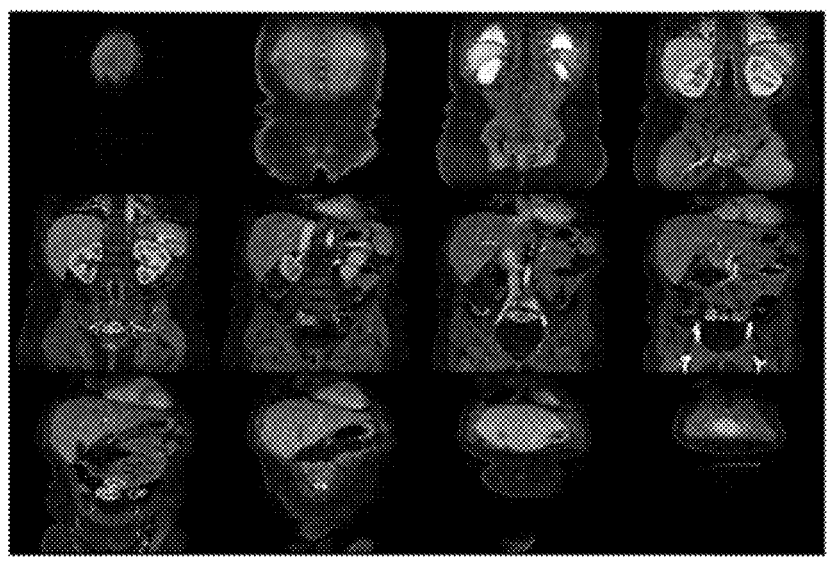
FIG. 15 illustrates an imaging example that uses signal coding, Cartesian k-space sampling trajectories and parallel receive acceleration.

A further example illustrates flexible tradeoffs between scan time, number of slices and image SNR. This example targets abdomen coverage with 32-channel parallel receive. Schemes of the type illustrated by 6C are used to signal-code and spatial-encode multiple coronal slices. Case 1 targets 12 slices that are of a uniform center-to-center spacing of 12 mm. Traversing of $k_x$-$k_{sc}$-$k_z$ with a Cartesian trajectory involves a total of 288 line segments that are parallel to $k_z$ (z=S/I) and evenly sample $k_x$-$k_{sc}$-$k_z$ space—with 72 phase encoding steps and 4 signal coding steps, this reflects a 9× acceleration (3× along phase encoding and 3× along signal coding). FIG. 15 shows the slice images reconstructed based on the signal data acquired with the accelerated scan.

Cases 2 and 3 have setups similar to that of Case 1 but target, respectively, 6 slices of 24 mm spacing and 3 slices of 48 mm spacing. A same 9× acceleration (3× along phase encoding and 3× along signal coding) is prescribed—traversing of $k_x$-$k_{sc}$-$k_z$ in Cases 2 and 3 involve, respectively, 144 line segments (72 phase encoding steps and 2 signal coding steps) and 72 line segments (72 phase encoding steps and 1 signal coding step). All three cases share one FIG. 12B—type 3D calibration, but with W's derived in accordance with their respective target slice prescriptions.

All three cases enjoy a same significant simplification in terms of formulating and solving reconstruction equations—in addition to a problem size reduction due to a Fourier transform along $k_z$, even sampling in $k_x$-$k_{sc}$ space enable a further reduction in problem or equation size, making the resultant smaller, separate sets of equations each engage an alias group comprised of only a small number of voxels. This readily enables rapid, parallelizable, closed-form equation solving.

Figure 16A:
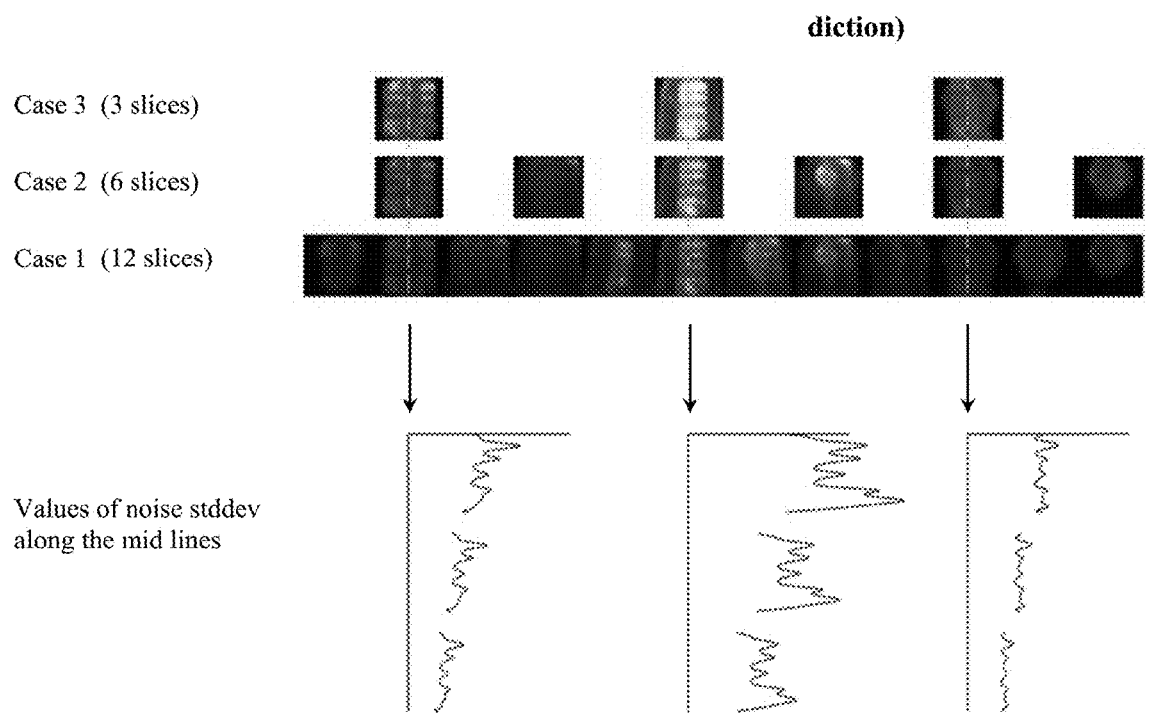
FIG. 16A-16B illustrate prediction of noise level of reconstructed images.
Figure 17:
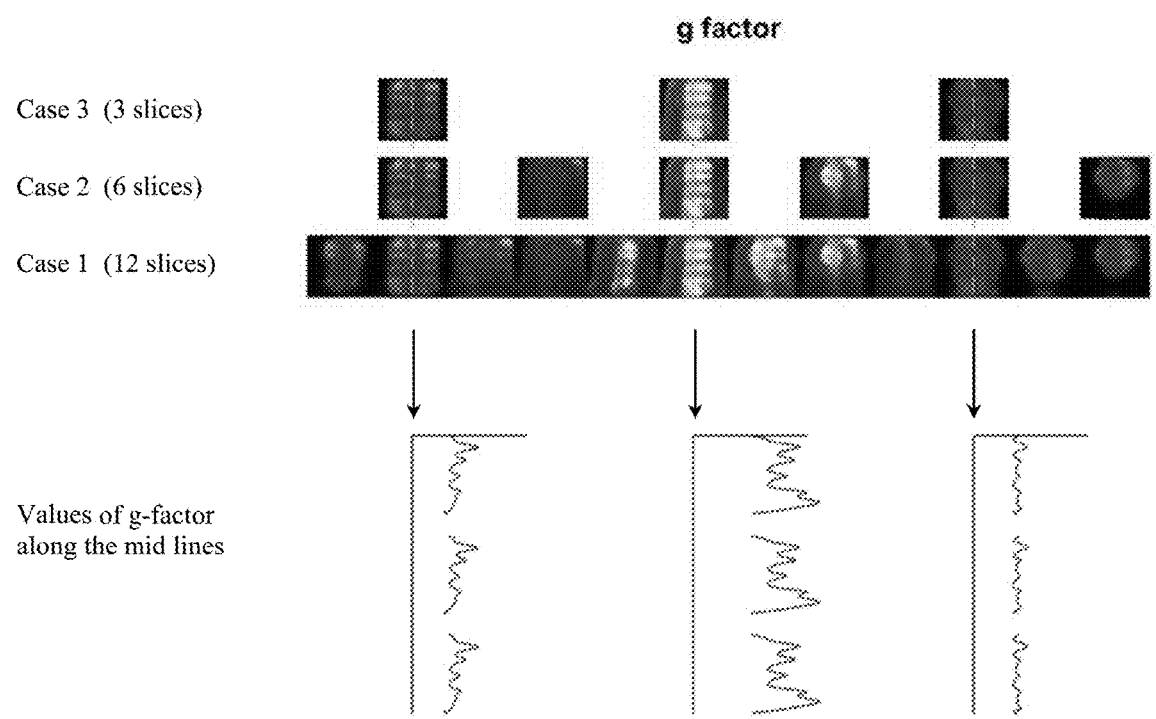
FIG. 17 is an illustration of quantified g factor maps.

The simplification of A's structure further allows a rapid, closed-form prediction of noise standard deviation of the final reconstructed images, providing a major clue on image SNR. FIG. 16A shows the noise level of reconstructed final images for Cases 1-3, predicted using only specifics about signal coding/spatial encoding (captured by E), information about parallel acquisition signal structure (captured by W) and noise level of acquired signal samples (see Noise calibration). This proactive SNR evaluation is of significance in practice—it uses a small amount of information that are available prior to actual scans, and may be used to guide adjustment/optimization of protocol, coding, encoding, or coils, before committing scans. FIG. 17 shows quantified g-factor values for Cases 1-3.

Figure 16B:
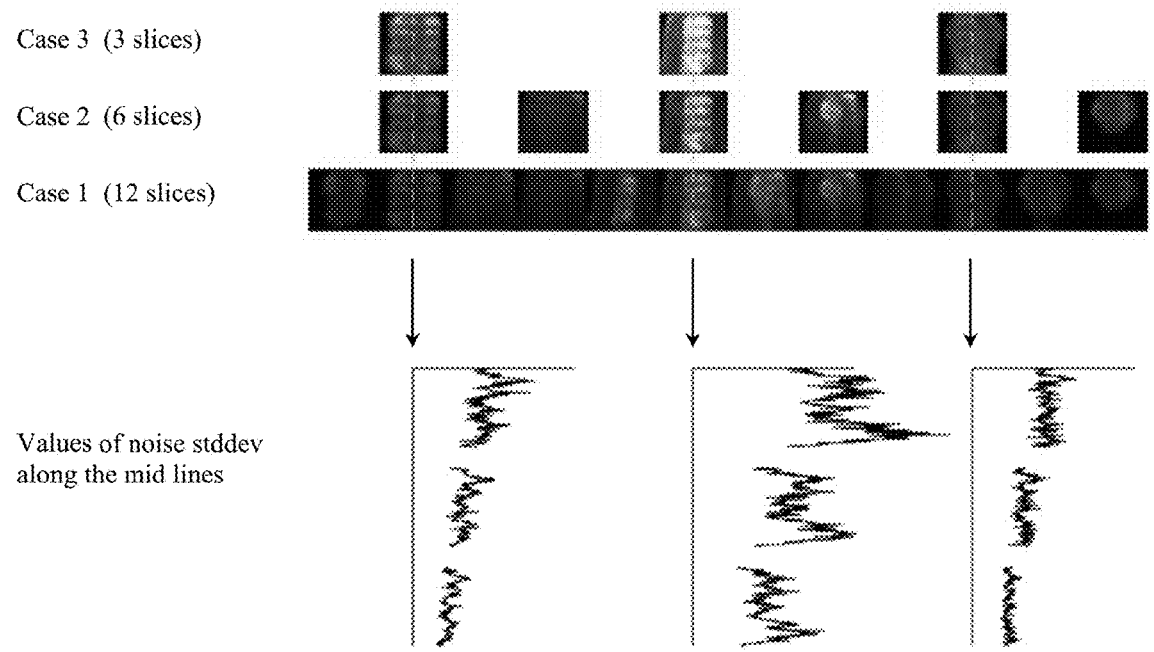

A Monte Carlo approach (see Prediction of recon result noise level and SNR) estimates noise standard deviation of the reconstructed results independently. FIG. 16B shows the results.

Notice the SNR gain in accordance with √N as illustrated by the present set of cases—this SNR multiplying effect is unprecedented in multi-slice MRI. Also notice the flexibility with the slice prescription and a substantial capacity for acceleration (including simultaneous acceleration along all encoding and coding dimensions). These demonstrate the present invention's potent support for advancing both the speed and SNR of multi-slice MRI.

D) Numerical Computation

A least-squares solution to reconstruction formulation of Eqn.18—form leads to reconstructed individual and combined images. There are a variety of numerical algorithms that support solving the least squares problems. Some of the numerical algorithms (e.g., lsqr) are particularly efficient as they accept W, $F_{m,n}$ and E that are implemented as operators (e.g., FFT, NUFFT, and etc.) and scale gracefully with problem size. Parallel computing technology readily supports speedup of N-channel Fourier and inverse Fourier transforms, which also helps accomplish a high reconstruction speed.

In a reconstruction formulation of Eqn.18—form, the signal coding and spatial encoding are captured by E, separate from PASS model that is captured by W. In the case of even or partially even sampling, or sampling of a certain canonical type, E's structure allows reduction of the reconstruction formulation into smaller, separate sets of equations, which facilitates rapid reconstruction calculations with direct inversion, intuitive grasp of the conditioning situation, and closed-form prediction of SNR profile.

Figure 18:
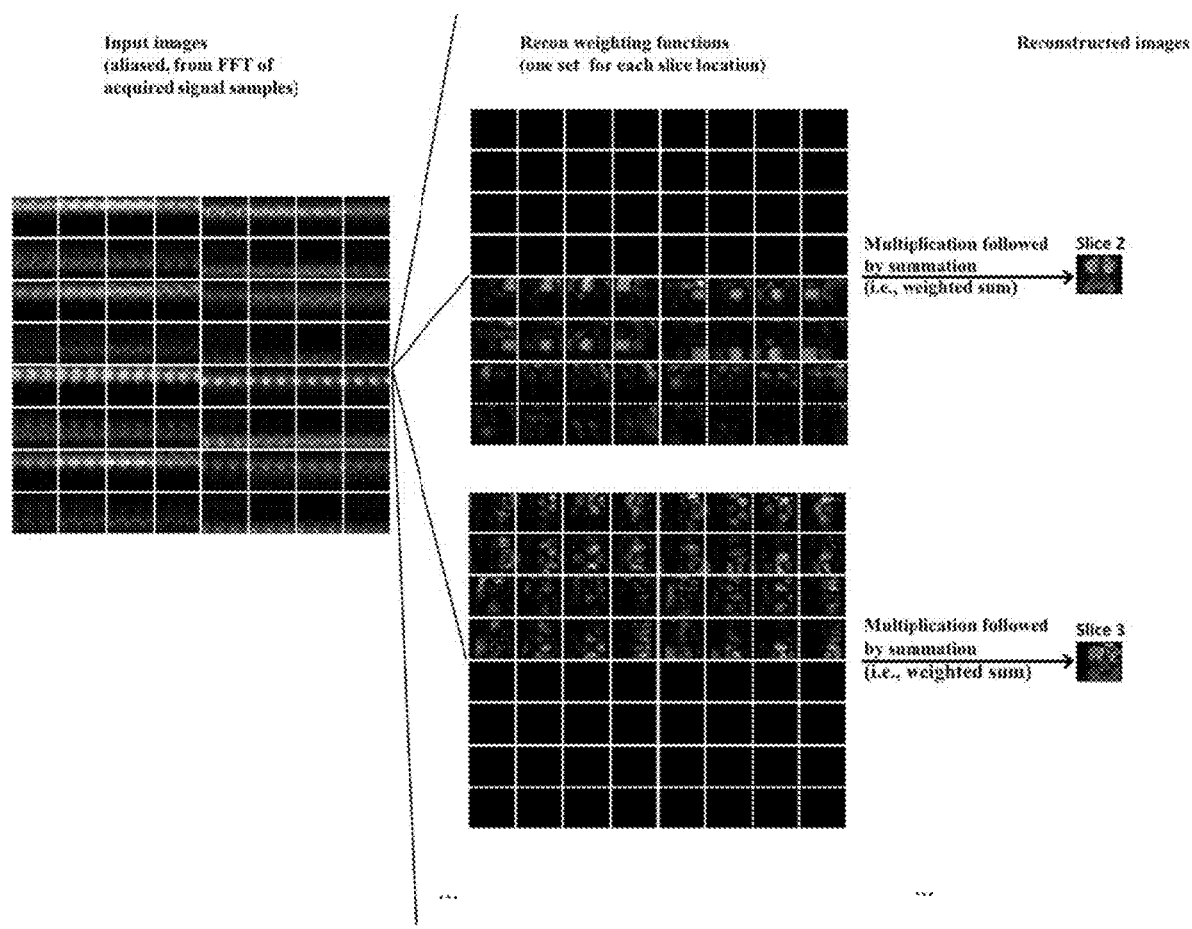
FIG. 18 illustrates an exemplary fast reconstruction that computes images by forming weighted sums of abased input images.

One additional benefit of this reduction is a unique method of reconstructing slice images by simply forming weighted sums of aliased input images. FIG. 18 gives a simple illustration using the 6-slice case (Case 2) of FIG. 16, The aliased input images are formed with inverse Fourier transform of the individual channel spectra (with un-sampled grid locations zero-filled) along $k_x$, $k_y$ and $k_{sc}$ directions. Reconstruction of each of the target slice is performed by multiplying the, aliased input images with a set of slice-specific recon weighting profiles and summing over AT, channels and N/$acc_k$ signal codings (summing a total of 32×6/3=64 weighted images in the present case). The recon weighting profiles are calculated from W's and the coding/encoding specifics, prior to actual scan (FIG. 12)—this makes reconstruction of slices upon acquiring of actual scan data exceedingly fast essentially at the speed of $N_c$N/$acc_k$ FFT's.

E) Noise Calibration

Noise calibration is an option that serves two purposes: 1) to gain an incremental SNR improvement in multi-channel receive cases by conditioning the acquired signal data prior to reconstruction, and 2) to support prediction of noise standard deviations/SNR profiles in reconstructed images.

Noise calibration can use a quick procedure where RF transmit remains shut (i.e., no spin excitation) and signal acquisition collects noise samples. Through statistical analysis, channel noise can then be characterized and noise variance/covariance be determined.

In an exemplary embodiment of parallel receive signal conditioning, R, the covariance matrix of the measurement noise associated with the multiple sensors, is first obtained through noise calibration, and a linear transform is then determined and applied to the multi-sensor raw data samples. For example, eigenvalue decomposition ($R=V\Lambda V^H$) or singular value decomposition ($R=U\Lambda^{1/2}V^H$) of the covariance matrix gives $L=\Lambda^{-1/2}V^H$ as the linear transform operator. The operator is applied to de-correlate noise amongst $N_c$ parallel receive channels, and the result is a new set of $N_c$-channel data that is related to the original set by:

$$[\text{signal}_{new}^{(1)} \ldots \text{signal}_{new}^{(Nc)}]^T = L[\text{signal}_{orig}^{(1)} \ldots \text{signal}_{orig}^{(Nc)}]^T$$

Conceptually, the new set of data samples can be considered as having been acquired with multiple new channels that are numerically synthesized by the transform, where the covariance matrix of measurement noise associated with the new channels is an identity matrix. Rendering noise uncorrelated and similarly distributed before feeding data samples to reconstruction helps advanced reconstruction methods manage interference effects of multi-channel measurement noise.

Once individual channel spectra or images are reconstructed based on the new set of data, one can optionally apply a further transform, before calculating the composite image (e.g., sum of squares), to effect restoration of the original image intensity profile:

$L^{-1}[\text{spectrum}_{new}^{(1)} \ldots \text{spectrum}_{new}^{(Nc)}]^T$ in k-space or $L^{-1}[\text{image}_{new}^{(1)} \ldots \text{image}_{new}^{(Nc)}]^T$ in image-space.

F) Prediction of Recon Result Noise Level and SNR

It can be shown that signal conditioning followed by setting up Eqn.18 and solving Eqn.18 with least squares, allow a prediction of noise covariance and noise standard deviation of the calculated y, i.e., the reconstructed individual channel images, and combined final images. Note that signal conditioning is not a prerequisite for the prediction but is beneficial to SNR of the reconstructed images—see Noise calibration. The expression for the noise covariance matrix of y is $$\text{COVAR}(\hat{y}) = (A^H R_{0b}^{-1} A)^{-1}, \quad \text{[Exemplary equation 19]}$$

where $R_0b$ represents the noise covariance matrix of the vector on the right-hand side of Eqn.18, and can be easily derived using the noise calibration result.

A Monte Carlo study that performs repeated reconstructions, each with emulated measurement noise samples as input, can estimate $(A^H R_{0b}^{-1} A)^{-1}$ as well as noise covariance and noise standard deviation of the reconstructed results.

As illustrated with the FIG. 16 cases, even sampling simplifies the structure of A. This allows, for example, reduction of Eqn.18 into smaller separate sets of equations, and reconstruction of slice images by solving said smaller separate sets of equations or by simply forming weighted sums of aliased input images (FIG. 18). The structure simplification also allows a rapid, closed-form prediction of noise standard deviation of the final reconstructed images (FIG. 16 cases), giving a major clue on image SNR.

Guidance from noise behavior prediction is valuable. It enables assessment and optimization of SNR in a proactive fashion, supporting, for instance, use of specifics about signal coding and spatial encoding and calibrated W to guide adaptation of coding, encoding or coils prior to actual scans.

G) Advanced Modeling and Generalization

Alternatively expressing reconstruction as an optimization problem can be useful. Example reconstruction formulation Eqn.18 in explicit optimization forms, can additionally incorporate regularization and/or other models, including spatial or temporal models that capture physics, statistics or other knowledge. For instance:

$$\text{argmin}_y \alpha^2 \|(I-W)y\|_2^2 + \|Ey-b\|_2^2 + \text{cost term(s) based on additional model(s)} \quad \text{[Exemplary equation 20]}$$

In incorporating a sparse model for regularization, Eqn.20 may include, for example, a cost term $\Sigma n_c \lambda^{(n_c)} \|\Psi y^{(n_c)}\|_1$ where $\Psi$ represents a sparsifying transform—the cost term in this case is based on a sparsity model capturing statistical knowledge that the distribution of $y^{(n_c)}$'s are sparse in the transform domain.

FIGS. 19A and B illustrate two example approaches to generating a result based on acquired signal samples and modeling: (A) Image reconstruction as a problem of finding the least squares solution to a set of equations. This set of equations is formed by pooling together subsets of equations, including one that expresses constraints due to a signal model, one that expresses constraints due to a structure model, and, if applicable, additional ones that capture physics, statistics or other knowledge. (B) Finding a result as an explicit or implicit optimization problem. The objective function includes cost terms that capture outcome's deviation from applicable models. The optimization approach flexibly accommodates regularization, additional spatial or temporal models that capture physics, statistics or other knowledge, and incorporation of knowledge with means such as machine learning.

The building block approach facilitates adaptation and expansion, beyond signal coding and multi-channel receive applications. In one aspect the building block approach is applied to multi-configuration imaging, which collects data and generates images by leveraging an intrinsic resemblance or redundancy.

Imaging with multi-channel receive is a special case of multi-configuration imaging where each RF receive channel represents a (detection) configuration. In this case underlying individual channel images resemble one another, differing only in the form of relative image shading due to differences in the channels' sensing profiles.

Parallel RF transmit MRI can analogously exploit the building block approach. In this case images, obtained from a sequence of small-tip-angle MRI experiments under transmit configurations each involving a subset of the parallel RF transmit channels, resemble one another, differing only in the form of relative image shading due to differences in the channels' $B1^+$ profiles. From the signal samples acquired in the sequence of experiments, a structure model in an Eqn. 14- or Eqn. 15—form can be determined. The relative shading as captured by the model, optionally augmented by an absolute $B1^+$ map that is separately obtained under one configuration, can be implicitly or explicitly used in parallel excitation pulse design, which is in turn applied in a parallel RF transmit MRI to generate an imaging result. One example way to apply the structure model here is to explicitly derive relative $B1^+$ profiles with, voxel-by-voxel, singular value decomposition of the W's, and optionally further derive absolute $B1^+$ profiles by scaling the relative profiles using the one absolute $B1^+$ map.

Another multi-configuration imaging example deals with off-resonance effect, chemical shifts, and use of multiple TE's. In this example, one can perform multiple MRI experiments with varying TE's and/or B0 shimming configurations so that the underlying images differ from one another in the form of relative image shading corresponding to resonance frequency-induced phase offsets. Analogous to the multi-channel receive case the relative image shading can be captured with a structure model. Further, the differing: shading profiles associated with the configurations, analogous to differing sensing profiles of the multi-channel receive case, can be exploited to reduce the requirement of acquiring signal samples and to accelerate imaging.

To collect data and generate images by leveraging an intrinsic resemblance or redundancy, multi-configuration imaging may identify and exploit the resemblance/redundancy by learning and applying a structure model via a machine learning means.

One embodiment comprises learning a compressed representation of assembled calibration/training data and applying the representation in reconstruction with a neural network. The learned compressed representation is considered as a determined structure model and a deviation from structure model (see FIG. 19B) is quantified by a metric measuring the difference between the reconstruction result and what the neural network output implies. In this case the neural network acts as a means for providing a metric that is a cost term in an optimization.

More intelligence and/or experience can be instilled into imaging. In assembling calibration/training data, an extraction operation more sophisticated than the stencil-based operation and tuned to accentuate salient features in the data, and/or images or data previously obtained under other imaging configurations may be employed. To enhance the performance of identifying and exploiting resemblance/redundancy, the machine learning means may incorporate vast prior data or a previously trained model—for example, a neural network in determining or learning a compressed representation can incorporate a previously trained autoencoder and take advantage of transfer learning. Note that much or all of acquiring, assembling and determining for the purpose of capturing resemblance/redundancy and constructing a structure model can take place prior to imaging, using results obtained from other configurations.

An embodiment illustrated by FIG. 19C incorporates the FIG. 19B—type optimization approach, an iterative framework, and a structure model that, for example, captures a resemblance amongst or redundancy within underlying images with an autoencoder neural network.

Some Example Use of the New Multi-Slice Imaging Technology

The new technology may positively impact a broad range of protocols. Meaningful examples may include the following.

SNR: upgrade N-slice imaging with an $\sqrt{N}$-fold SNR increase

An example scenario: Given a same multi-planar MRI task for 4 or more slices, the new technology run on 1.5 T delivers better SNR than a standard technology run on 3 T does.

Coverage: maintain SNR when replacing n-NEX with 1-NEX but n-times more coverage An example scenario: Given a certain time budget, instead of 3 slices and 2-NEX, the new technology acquires 6 slices with same or better SNR.

Flexibility: offer a nimble alternative to volumetric imaging and support 3D acceleration An example scenario: Instead of a lengthy volumetric protocol, the new technology samples the target volume with A slices, with significant improvement over conventional N-slice imaging both in scan time and SNR.

The illustrations presented so far include several that are quite revealing of the essence (e.g., FIG. 2), form (e.g., FIG. 3) and capacity (e.g., Eqn.18) of signal coding. It is useful to recap some aspects of the present invention in the light of the comprehensive framework.

Consider Eqn.18. In general, $y_n$, the nth block of vector y, may represent individual channel images corresponding to the nth of a total of N components, where the N components have a distribution spatially, spectrally, or in a general parameter space. The probing experiments the composite sequence pools may cause different components to experience different cumulative RF and gradient activities, TE's, or even TR's, hence imparting $y_n$'s with varying characteristics (e.g., contrast). Being able to code signals through excitation that is component selective facilitates implementation of distinctive weights, but is not a necessity. Other mechanisms that effect diverse entries in matrix A and render inversion of Eqn.18 a reasonably conditioned problem are valid alternatives. A basic consideration is to cause acquisition of signals that reflect a sufficient number of weighted combinations of the N components. A thorough development would take advantage of the modules of the comprehensive framework.

One idea for designing/prescribing a new imaging scheme is to follow these steps:
choose target and characteristics of interest that may fit in in a composite sequence,
plan signal coding, spatial coding and parallel receive setup against a given time budget and fill entries of A,
verify practicality by evaluating the conditioning of A and behavior of noise propagation,
if there are significant issues identified, return to 1) and make goal/plan adjustments to rein in the issues, otherwise, test/run the imaging scheme in actual scans.

A further consideration for improving conditioning is to leverage an optimization formulism and advanced modeling (see examples in Advanced modeling and generalization).

System Support for Signal Coding

Figure 20A:
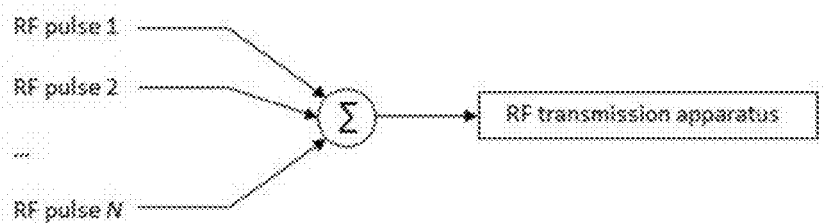
FIG. 20A-20B show two exemplary systems for performing RF transmit in accordance with signal coding.
Figure 20B:
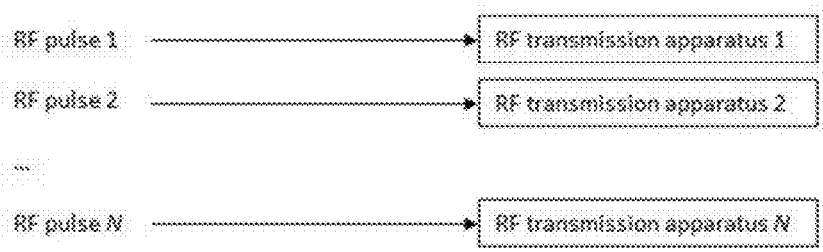

FIG. 20 shows two example systems for performing RF transmit in accordance with signal coding. In FIG. 20A system, the RF pulses are synthesized, and then added/concatenated to form a composite RF pulse. Finally the composite RF pulse is amplified to drive a transmission coil. FIG. 20B system has parallel transmission channels. With the FIG. 20B system, synthesized RF pulses are individually amplified and then fed to a transmission cod array, effecting superposition of RF fields in the imaged object. The second approach has a lower requirement on power and/or bandwidth and facilitates synergistic application of parallel RF transmission with signal coding.

Figure 21:
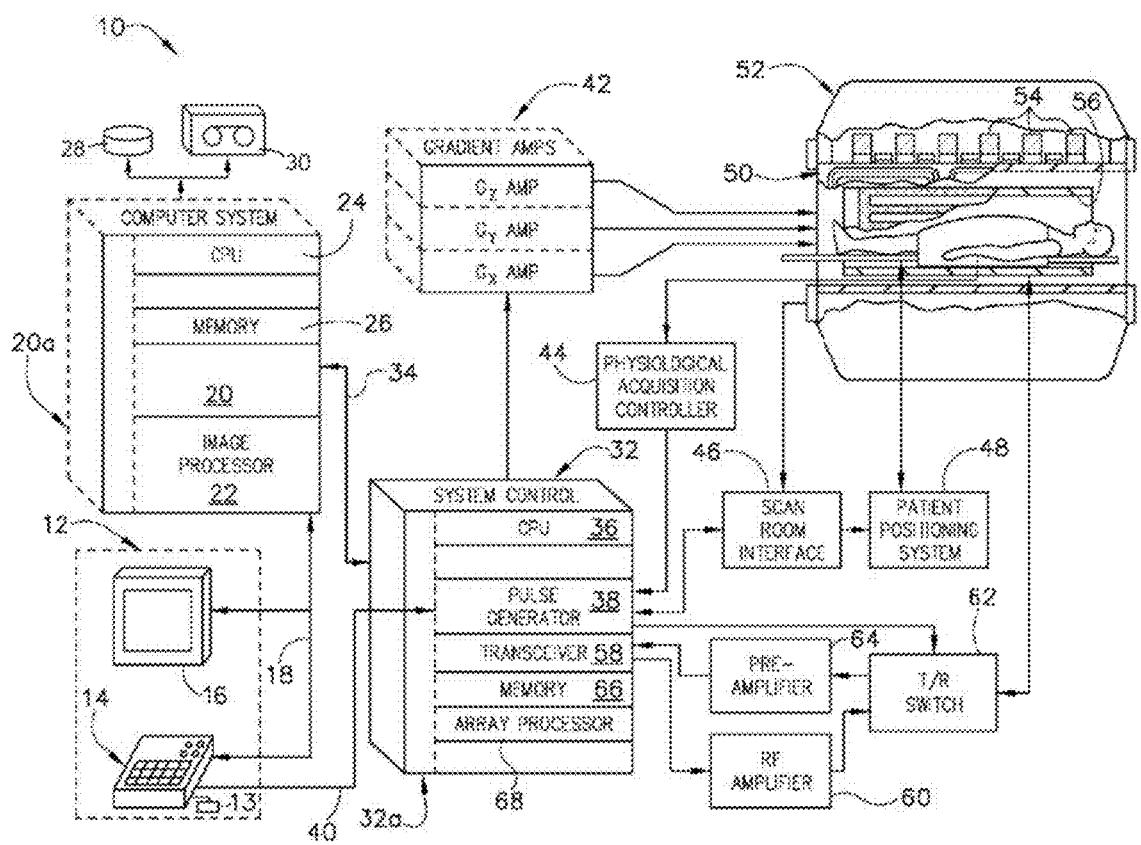
FIG. 21 is a schematic block diagram of a magnetic resonance imaging system for use with the present invention.

Referring to FIG. 21, the major components of an example magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates, for RF transmit, the timing, strength and shape of the RF pulses produced, and, for RF receive, the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 and a polarizing magnet 54 form a magnet assembly 52. An RF coil assembly 56 is placed between the gradient coil assembly 50 and the imaged patient. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 and coupled through the transmit/receive switch 62 to a preamplifier module 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil assembly 56 during the transmit mode and to connect the preamplifier module 64 to the coil assembly 56 during the receive mode. The transmit/receive switch 62 can also enable a separate RF coil (for example, a surface coil) to be used in either the transmit or receive mode. The transceiver module 58, the separate RF coil and/or the coil assembly 56 are commonly configured to support parallel acquisition operation.

The MR signals picked up by the separate RF coil and/or the RF coil assembly 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data to combine MR signal data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

While the above descriptions of methods and systems contain many specificities, these should not be construed as limitations on the scope of any embodiment, but as exemplifications of the presently preferred embodiments thereof. Many other ramifications and variations are possible within the teachings of the various embodiments.

What is claimed is:

1. An imaging system for imaging an object, comprising:
a hardware system for performing magnetic resonance signal excitation and detection,
a computer system electrically connected to said hardware system, comprising:
at least one display;
at least one processor; and
non-transitory computer readable media, comprising computer readable code configured to cause the at least one processor to:
devise a coding scheme for modifying the probing that a plurality of components of said object experience during imaging,
execute a set of procedures which causes said plurality of components to experience diverse probing via said coding scheme and to create at least one composite signal,
acquire said at least one composite signal,
process said at least one composite signal and reconstruct at least one image using at least one predetermined relation between said at least one composite signal and said at least one image, said processing and reconstructing comprising resolving contributions from said plurality of components,
whereby said coding, processing and reconstructing comprises a substantially integral treatment of said plurality of components,
further comprising a structure model capturing a resemblance amongst or redundancy within elements selected from the group comprising said at least one image and images obtained from additional imaging configurations,
wherein said imaging system is a magnetic resonance imaging system and said structure model captures a resemblance in the form of relative image shading.

2. An imaging system, comprising:
a hardware system for performing magnetic resonance signal excitation and detection,
a computer system electrically connected to said hardware system, comprising:
at least one display;
at least one processor; and
non-transitory computer readable media, comprising:
computer readable code configured to cause the at least one processor to:
identify a signal model, said signal model relating signal samples detected during imaging to at least one underlying image,
conduct imaging and acquiring, with a multi-configuration setup or with a substantially sequential timing, a data set comprising said signal samples,
form a data assembly by applying an extraction operation to said data set or a functionally equivalent data set or both,
determine a structure model by learning from said data assembly, said structure model capturing a resemblance amongst or redundancy within elements selected from the group comprising said at least one underlying image and images obtained from additional imaging configurations, and
generate a result consistent with said signal samples and said structure model, said result being selected from the group comprising a spectrum, a set of spectra, an image, a set of images, a map, a set of maps, and a physical quantity distribution,
wherein said generating of the result comprises solving an optimization problem, said optimization problem having cost terms selected from the group comprising deviation from said structure model, deviation from said signal model, and deviation from any further models specifically applicable.

3. A magnetic resonance imaging apparatus, comprising:
a. a hardware system for performing magnetic resonance signal excitation and detection,
b. a computer system electrically connected to said hardware system, comprising:

at least one display;

at least one processor; and non-transitory computer readable media, comprising:

computer readable code for applying said magnetic resonance signal excitation and detection, computer readable code, comprising a k-space sampling scheme or a coding scheme or both, for methodically acquiring, with a multi-configuration setup or with a substantially sequential timing, a data set comprising magnetic resonance signal samples, computer readable code for forming a data assembly by applying an extraction operation to said data set or a functionally equivalent data set or both, computer readable code for determining a structure model in said data assembly, computer readable code for generating a result consistent with said signal samples and said structure model, and computer readable code for displaying said result on said at least one display, wherein said generating of the result comprises solving an optimization problem, said optimization problem having cost terms selected from the group comprising deviation from said structure model, deviation from said signal model, and deviation from any further models specifically applicable.

4. The imaging system of claim 1, wherein said coding scheme comprises marking said components with modulating weights, said modulating weights being selected from the group comprising phase-modulating weights, amplitude-modulating weights, and phase- and amplitude-modulating weights.

5. The imaging system of claim 1, wherein said set of procedures causes to create said at least one composite signal by effecting combination of experiments and superposition of signals thereof.

6. The imaging system of claim 1, wherein said imaging system is a magnetic resonance imaging system, said reconstructing is in a space of at least one of spatial, spectral and other characteristic dimensions, and said reconstructing comprises an image reconstruction scheme taking into account said coding.

7. The imaging system of claim 1, further including at least one of predicting noise level of said at least one image and performing optimization of the setup for said imaging.

8. The imaging system of claim 2 wherein said determining a structure model is finding a mathematical representation selected from the group comprising a vector space, a basis, a matrix, a set of maps, a set of weights, a set of networks, a set of operators and a set of functions.

9. The imaging system of claim 2, wherein said generating the result comprises solving a set of equations, said set of equations being selected from the group comprising expressions of constraints due to said structure model, expressions of constraints due to said signal model, and expressions of further constraints derived from physics and statistics that are specifically applicable.

10. The imaging system of claim 2, wherein said signal model comprises a mathematical representation of coding, said coding modifying the probing that a plurality of components experience during their imaging.

11. The imaging system of claim 2, wherein said imaging system is a magnetic resonance imaging system and said structure model captures a resemblance in the form of relative image shading.

12. The imaging system of claim 2, wherein said generating a result uses a strategy comprising at least one of reducing whole problem into a set of smaller problems and performing a substantial amount of computation before completion of said acquiring a data set.

13. The imaging system of claim 6, wherein said coding scheme causes said plurality of components to experience varying effects due to at least one from the group consisting radio-frequency field, gradient field, B0 field and imaging sequence timing.

14. The imaging system of claim 6, wherein said plurality of components comprises slices distributed in spatial dimensions and said reconstructing comprises spatial mapping.

15. The imaging system of claim 6, wherein said coding scheme comprises marking said components with modulating weights via field manipulation, said field manipulation including at least one from the group comprising radio-frequency excitation, gradient pulsing and B0 field shimming.

16. The imaging system of claim 11, wherein said acquiring a data set is at least one operation from the group comprising detecting magnetic resonance signals with parallel radio-frequency receive channels, detecting magnetic resonance signals in a sequence of experiments each using a predetermined subset of parallel radio-frequency transmit channels, detecting magnetic resonance signals in separate experiments characterized by varying image contrast or echo timing or both.

17. The imaging system of claim 15, wherein said field manipulation effects reduced sampling requirement and acceleration of imaging.

18. The imaging system of claim 15, wherein said field manipulation effects field-of-view packing.

* * * * *